(12) United States Patent
Wada et al.

(10) Patent No.: US 6,304,206 B1
(45) Date of Patent: *Oct. 16, 2001

(54) VOLTAGE COMPARATOR, OPERATIONAL AMPLIFIER AND ANALOG-TO-DIGITAL CONVERSION CIRCUIT EMPLOYING THE SAME

(75) Inventors: Atsushi Wada; Kuniyuki Tani, both of Ogaki (JP)

(73) Assignee: Sanyo Electric Co., Ltd., Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 43 days.

(21) Appl. No.: 09/145,285

(22) Filed: Sep. 2, 1998

(30) Foreign Application Priority Data

Sep. 4, 1997 (JP) .................................................. 9-239810
Sep. 30, 1997 (JP) .................................................. 9-267402

(51) Int. Cl.$^7$ ........................................................ H03M 1/34
(52) U.S. Cl. ............................................. 341/162; 341/161
(58) Field of Search ................................ 341/58, 59, 161, 341/156, 155, 172; 327/91, 94, 97

(56) References Cited

U.S. PATENT DOCUMENTS

| 5,159,342 | * | 10/1992 | Yotsuyanagi | 341/161 |
| 5,274,377 | * | 12/1993 | Matsuura et al. | 341/161 |
| 5,821,893 | * | 10/1998 | Kumamoto et al. | 341/161 |

FOREIGN PATENT DOCUMENTS

| 5-14199 A | 1/1993 | (JP) . |
| 5-326713 A | 12/1993 | (JP) . |
| 8-79078 A | 3/1996 | (JP) . |
| 9-69776 | 3/1997 | (JP) . |
| 9-148850 A | 6/1997 | (JP) . |

OTHER PUBLICATIONS

Japanese Patent Office –Notification of Reason(s) for Refusal–10/5/00.

* cited by examiner

Primary Examiner—Brian Young
Assistant Examiner—John Nguyen
(74) Attorney, Agent, or Firm—Armstrong, Westerman, Hattori, McLeland & Naughton, LLP

(57) ABSTRACT

In an analog-to-digital conversion circuit having a multi-stage pipeline structure, a plurality of stages of operational amplifiers are provided in a circuit of each stage. In the circuit of each stage, an analog input signal outputted from the circuit of the precedent stage is supplied to the precedent operational amplifier and a sub A-D converter. The sub A-D converter supplies the result of A-D conversion to a D-A converter. A subtraction circuit performs subtraction of an output of the precedent operational amplifier and a result of D-A conversion of the D-A converter. The subsequent operational amplifier amplifies an output of the subtraction circuit and supplies the same to the circuit of the subsequent stage. In each operational amplifier, a first switch is connected between a first input node and a first output node, a second switch is connected between a second input node and a second output node, and a third switch is connected between the first and second output nodes. Two switches are connected in parallel with the first input node through a capacitor. Two switches are connected in parallel with the second input node through a capacitor. The first and second switches are moved to OFF and the third switch is moved to ON, and then the third switch is moved to OFF after a constant time.

24 Claims, 15 Drawing Sheets

VOLTAGE COMPARATOR, OPERATIONAL AMPLIFIER AND ANALOG-TO-DIGITAL CONVERSION CIRCUIT EMPLOYING THE SAME

BACKGROUND OF THE INVENTION

1. Field of the Invention

The present invention relates to a voltage comparator, an operational amplifier, and an analog-to-digital conversion circuit, having an analog-to-digital converter and a multi-stage pipeline (multi-step flush) structure, employing the voltage comparator and the operational amplifier.

2. Description of the Prior Art

Following the recent development of the digital processing technique for video signals, an analog-to-digital conversion circuit (A-D converter) for processing video signals is increasingly demanded. In general, a two-step flush (two-step parallel) system is widely employed for such an analog-to-digital conversion circuit for processing video signals, which must perform high-speed conversion.

However, the analog-to-digital conversion circuit of the two-step flush system cannot attain sufficient conversion accuracy for an enormous number of converted bits. To this end, an analog-to-digital conversion circuit having a multi-stage pipeline (multi-step flush) structure has been developed.

FIG. 14 is a block diagram showing the structure of a conventional analog-to-digital conversion circuit 101 having a multistage pipeline structure. The analog-to-digital conversion circuit 101 shown in FIG. 14 has a 10-bit four-stage pipeline structure.

Referring to FIG. 14, the analog-to-digital conversion circuit 101 includes a sample-and-hold circuit 102, a first-stage circuit 103, a second-stage circuit 104, a third-stage circuit 105, a fourth-stage circuit 106, a plurality of latch circuits 107 and an output circuit 108.

Each of the first-stage (initial stage) to third-stage circuits 103 to 105 comprises a sub A-D converter 109, a D-A converter 110 and a differential amplifier 111. The fourth-stage (final stage) circuit 106 comprises only a sub A-D converter 109.

The first-stage circuit 103 has a 4-bit structure, and the second- to fourth-stage circuits 104 to 106 have 2-bit structures respectively.

Operations of the analog-to-digital conversion circuit 101 are now described. The sample-and-hold circuit 102 samples an analog input signal Vin and holds the same for a constant time. The analog input signal Vin outputted from the sample-and-hold circuit 102 is transferred to the first-stage circuit 103.

In the first-stage circuit 103, the sub A-D converter 109 A-D converts the analog input signal Vin. The sub A-D converter 109 transfers the result of A-D conversion, i.e., a high order 4-bit digital output ($2^9$, $2^8$, $2^7$, $2^6$) to the D-A converter 110 while transferring the same to the output circuit 108 through four latch circuits 107. The differential amplifier 111 amplifies the difference between the result of D-A conversion of the D-A converter 110 and the analog input signal Vin. The differential amplifier 111 transfers its output to the second-stage circuit 104.

The second-stage circuit 104 performs operations similar to those of the first-stage circuit 103 on the output from the differential amplifier 111 of the first-stage circuit 103. The third-stage circuit 105 performs operations similar to those of the first-stage circuit 103 on an output from the differential amplifier 111 of the second-stage circuit 104. The second-stage circuit 104 provides an intermediate high order 2-bit digital output ($2^5$, $2^4$), while the third-stage circuit 105 provides an intermediate low order 2-bit digital output ($2^3$, $2^2$).

In the fourth-stage circuit 106, the sub A-D converter 109 A-D converts an output from the differential amplifier 111 of the third-stage circuit 105, to provide a low order 2-bit digital output ($2^1$, $2^0$).

The digital outputs from the first- to fourth-stage circuits 103 to 106 simultaneously reach the output circuit 108 through the respective latch circuits 107. In other words, the latch circuits 107 are adapted to synchronize the digital outputs from the circuits 103 to 106 with each other.

The output circuit 108 outputs a 10-bit digital output Dout of the analog input signal Vin in parallel after digital correction, if necessary.

Thus, in each of the first- to third-stage circuits 103 to 105 of the analog-to-digital conversion circuit 101, the differential amplifier 111 amplifies the difference between the analog input signal Vin or the output from the differential amplifier 111 of the precedent circuit 103 or 104 and the result of D-A conversion of the digital output thereof.

Even if the number of converted bits is increased to reduce the least significant bit (LSB), therefore, the resolution of comparators forming each sub A-D converter 109 can be substantially improved for attaining sufficient conversion accuracy.

Following the recent speed increase of electronic apparatuses, a higher conversion speed is required to analog-to-digital converters. In order to increase the conversion speed of the aforementioned conventional analog-to-digital conversion circuit 101, the GB product (gain-bandwidth product) of an operational amplifier forming each differential amplifier 111 must be increased. However, improvement of the GB product of the operational amplifier is limited. Therefore, it is difficult to further increase the conversion speed of the analog-to-digital conversion circuit 101.

As hereinabove described, the A-D converter of each circuit is referred to as the sub A-D converter 109, to be distinguished from the overall analog-to-digital conversion circuit 101. A total parallel comparison (flush) system which can perform high-speed conversion is employed for the sub A-D converter 109. The sub A-D converter 109 includes a plurality of comparators comparing an input voltage with a plurality of reference voltages. Each comparator is formed by a differential voltage comparator.

FIG. 15 is a circuit diagram of a conventional differential voltage comparator.

Referring to FIG. 15, a differential amplification circuit 10 includes P-channel MOS field-effect transistors (hereinafter referred to as PMOS transistors) 1 and 2, N-channel MOS field-effect transistors (hereinafter referred to as NMOS transistors) 3 and 4 and a constant current source 7.

The PMOS transistors 1 and 2 are connected between a node ND and output nodes NO1 and NO2 respectively. The NMOS transistors 3 and 4 are connected between the output nodes NO1 and NO2 and a node NS respectively.

The node ND is supplied with a power supply voltage $V_{DD}$, while the node NS is grounded through the constant current source 7. The PMOS transistors 1 and 2 are supplied with a bias voltage VB in the gates thereof respectively. The gates of the NMOS transistors 3 and 4 are connected to input nodes NA and NB respectively.

The input nodes NA and NB are connected to nodes N1 and N2 through capacitors 5 and 6 respectively. Switches SW11 and SW21 are connected between the input nodes NA and NB and the output nodes NO1 and NO2 respectively. Switches SW12 and SW13 are connected in parallel with the node N1, while switches SW22 and SW23 are connected in parallel with the node N2.

The switches SW12 and SW13 are supplied with input voltages $V_1(+)$ and $V_2(+)$ in input ends thereof respectively, while the switches SW22 and SW23 are supplied with input voltages $V_1(-)$ and $V_2(-)$ in input ends thereof respectively. Output voltages $V_0(+)$ and $V_0(-)$ are derived from the output nodes NO1 and NO2 respectively.

FIG. 16 is adapted to illustrate operations of the differential voltage comparator shown in FIG. 15.

First, the switches SW11, SW21, SW12 and SW22 are moved to ON, while the switches SW13 and SW23 are moved to OFF. At this time, differential input voltages between the input nodes NA and NB and between the output nodes NO1 and NO2 are 0 V.

Then, the switches SW11 and SW21 are moved to OFF, and thereafter the switches SW12 and SW22 are moved to OFF, while the switches SW13 and SW23 are moved to ON. Thus, voltages of the input nodes NA and NB change by $V_2(+)-V_1(+)$ and $V_2(-)-V_1(-)$ respectively. The difference between the input voltages $V_1(+)$ and $V_2(+)$ is referred to as a differential input voltage $\Delta V(+)$, and that between the input voltages $V_1(-)$ and $V_2(-)$ is referred to as a differential input voltage $\Delta V(-)$.

The differential amplification circuit 10 compares the differential input voltages $\Delta V(+)$ and $\Delta V(-)$ with each other, so that one of the output voltages $V_0(+)$ and $V_0(-)$ from the output nodes NO1 and NO2 changes toward the power supply voltage $V_{DD}$ and the other one changes toward the ground potential. Thus, the differential output voltage between the output nodes NO1 and NO2 changes to a positive or negative side.

In the differential voltage comparator shown in FIG. 15, each of the switches SW11 to SW13 and SW21 to SW23 is generally formed by a CMOS switch. FIGS. 17(a) and 17(b) are circuit diagrams of such a CMOS switch SW.

The switch SW shown in FIG. 17(a) is formed by a PMOS transistor 501 and an NMOS transistor 502, as shown in FIG. 17(b). The PMOS and NMOS transistors 501 and 502 are supplied with complementary control signals SA and SB in the gates thereof respectively.

In such a CMOS switch SW, parasitic capacitances Cs are present between the gates and sources and between the gates and drains of the PMOS and NMOS transistors 501 and 502. Therefore, switching noise depending on an input voltage in an ON or OFF state of the CMOS switch SW is transmitted through capacitive coupling of the parasitic capacitances Cs.

In the differential voltage comparator shown in FIG. 15, such switching noise causes noise n in the differential input voltage between the input nodes NA and NB, as shown in FIG. 16. Thus, the differential output voltage between the output nodes NO1 and NO2 temporarily changes on the basis of the noise n and thereafter changes to indicate the essential result of comparison. Consequently, it takes time to stabilize the differential output voltage between the output nodes NO1 and NO2 in the state indicating the essential result of comparison, and hence a subsequent circuit receiving the output signals $V_0(+)$ and $V_0(-)$ of the differential voltage comparator cannot obtain the result of comparison in a short time. Therefore, the speed of an analog-to-digital conversion circuit employing such a differential voltage comparator cannot be increased.

SUMMARY OF THE INVENTION

An object of the present invention is to provide an analog-to-digital conversion circuit which is increased in conversion speed while maintaining high conversion accuracy.

Another object of the present invention is to provide a voltage comparator which can perform a high-speed operation while eliminating influence by noise, an analog-to-digital converter comprising the voltage comparator, and an analog-to-digital conversion circuit comprising the analog-to-digital converter.

Still another object of the present invention is to provide an operating method of a voltage comparator which can perform a high-speed operation while eliminating influence by noise.

An analog-to-digital conversion circuit according to an aspect of the present invention comprises a plurality of stages of circuits each including an analog-to-digital converter, a digital-to-analog converter, a subtraction circuit, and operational amplifiers provided in a plurality of stages.

In this analog-to-digital conversion circuit, the operational amplifiers in each stage of the circuits are provided in a plurality of stages, whereby the loop constant of the operational amplifier per stage as well as the load capacitance of the operational amplifier per stage can be reduced. Thus, the limit operating frequency of each operational amplifier is increased. Consequently, the conversion speed can be increased while maintaining high conversion accuracy without improving the performance of each operational amplifier.

The plurality of stages of circuits may be in a multistage pipeline structure. Further, the gain of each stage of the operational amplifiers provided in a plurality of stages in at least second and higher stages of the circuits may be set to exceed 1.

Thus, the gain of the operational amplifier per stage can be reduced while keeping the gain of each of the second and higher stages of the circuits.

An output of a precedent operational amplifier of the plurality of stages of operational amplifiers in each stage of the circuits may be supplied to the subtraction circuit in the same stage of the circuits, and an output of a subsequent operational amplifier of the plurality of stages of operational amplifiers in each stage of the circuits may be supplied to the analog-to-digital converter and the operational amplifier in the subsequent stage of the circuits.

In this case, amplification by the precedent operational amplifier and analog-to-digital conversion by the analog-to-digital converter can be performed in parallel with each other in the circuit of each stage. Thus, analog-to-digital conversion, digital-to-analog conversion and amplification in each stage of the circuits can be implemented within one clock. Consequently, the timings of analog-to-digital conversion by the analog-to-digital converter and digital-to-analog conversion by the digital-to-analog converter are relaxed in the circuit of each stage.

An analog-to-digital conversion circuit according to another aspect of the present invention has a multistage pipeline structure formed by a plurality of stages of circuits, and each stage of the circuits excluding the final stage of circuits includes an analog-to-digital converter converting an analog signal supplied from the precedent stage of the circuits to a digital signal, at least one stage of first operational amplifier amplifying an analog signal supplied from the precedent stage of the circuits, a digital-to-analog converter converting a digital signal outputted from the analog-to-digital converter to an analog signal, a subtraction circuit performing subtraction of an analog signal outputted from the first operational amplifier and an analog signal outputted from the digital-to-analog converter, and at least one stage of second operational amplifier amplifying an analog signal outputted from the subtraction circuit.

In this analog-to-digital conversion circuit, each stage of the circuits includes at least one first operational amplifier and at least one second operational amplifier, whereby the loop constant of the operational amplifier per stage as well as the load capacitance of the operational amplifier per stage can be reduced. Thus, the limit operating frequency of each operational amplifier is increased. Consequently, the conversion speed can be increased while maintaining high conversion accuracy without improving the performance of each operational amplifier itself.

Further, amplification by the first operational amplifier and analog-to-digital conversion by the analog-to-digital converter can be performed in parallel with each other in the circuit of each stage. Thus, analog-to-digital conversion, digital-to-analog conversion and amplification in each stage of the circuits can be implemented within one clock. Consequently, the timings of analog-to-digital conversion by the analog-to-digital converter and digital-to-analog conversion by the digital-to-analog converter are relaxed in the circuit of each stage.

The gain of the first operational amplifier in the initial stage of the circuits may be at least 1. When the gain of the first operational amplifier in the initial stage of the circuits is 1, the first operational amplifier performs a sample-and-hold operation. When the gain of the first operational amplifier in the initial stage of the circuits is in excess of 1, on the other hand, the first operational amplifier performs amplification.

The final stage of the circuits may include an analog-to-digital converter converting an analog signal supplied from the precedent stage of the circuits to a digital signal.

In this case, the analog-to-digital converter in the final stage of the circuits provides lower order bits of a digital output.

The initial stage of the circuits may have a bit structure set to be larger by at least two bits than that in the second and higher stages of the circuits, and the second to final stages of the circuits may have a bit structure uniformly divided.

Thus, the speed of conversion can be increased while maintaining higher conversion accuracy.

A voltage comparator according to still another aspect of the present invention comprises a comparing circuit performing a comparing operation, and an output circuit starting an output operation after a constant time from starting of the comparing operation of the comparing circuit.

This voltage comparator starts the output operation after the constant time from starting of the comparing operation, thereby outputting an output signal indicating the result of comparison after noise substantially disappears.

Therefore, the output signal is not influenced by the noise but immediately changes to a state indicating the essential result of comparison. Therefore, a voltage comparator which can perform a high-speed operation while eliminating influence by noise is implemented.

The comparing circuit may have first and second output terminals outputting signals complementary to each other, and the output circuit may include a switch substantially shorting the first and second output terminals when noise appears and opening the first and second output terminals after the noise substantially disappears.

In this case, the first and second terminals are substantially shorted when noise appears and then opened after the noise substantially disappears, thereby outputting complementary output signals indicating the result of comparison after the noise substantially disappears.

Therefore, the output signals are not influenced by noise but immediately change to states indicating the essential result of comparison. Therefore, a voltage comparator which can perform a high-speed operation while eliminating influence by noise is implemented.

A voltage comparator according to a further aspect of the present invention comprises a comparing circuit comparing first and second input voltages inputted in first and second input terminals respectively with each other and outputting the results of comparison as first and second output voltages complementary to each other from first and second output terminals, and a switch substantially shorting the first and second output terminals before the first and second input voltages are inputted to the first and second input terminals and opening the first and second output terminals in a delay by a constant time from supply of the first and second input voltages to the first and second input terminals.

This voltage comparator substantially shorts the first and second output terminals before receiving the first and second input voltages and opens the first and second output terminals in a delay by a constant time from supply of the first and second input voltages, thereby outputting the complementary first and second output voltages indicating the results of comparison after noise appearing in supply of the first and second input voltages substantially disappears.

Therefore, the first and second output signals are not influenced by noise but immediately change to states indicating the essential results of comparison. Therefore, a voltage comparator which can perform a high-speed operation while eliminating influence by noise is implemented.

The first input voltage may be a first differential input voltage, and the second input voltage may be a second differential input voltage.

In this case, the voltage comparator substantially shorts the first and second output terminals before receiving the first and second differential input voltages and opens the first and second output terminals in a delay by a constant time from supply of the first and second input voltages, thereby outputting the complementary first and second output voltages indicating the results of comparison after noise appearing in supply of the first and second differential input voltages substantially disappears.

Therefore, the first and second output signals are not influenced by noise but immediately change to states indicating the essential results of comparison. Therefore, a voltage comparator which can perform a high-speed operation while eliminating influence by noise is implemented.

A voltage comparator according to a further aspect of the present invention comprises a differential amplification circuit having first and second input terminals and first and second output terminals, a first switch connected between the first input terminal and the first output terminal, a second switch connected between the second input terminal and the second output terminal, a first capacitance connected to the first input terminal, a second capacitance connected to the second input terminal, and a third switch connected between the first and second output terminals. The first, second and third switches are brought into ON states while first and second input voltages are supplied to input ends of the first and second capacitances respectively, thereafter the first and second switches are brought into OFF states while third and fourth input voltages are supplied to the input ends of the first and second capacitances respectively, and the third switch is brought into an OFF state after a constant time.

In this voltage comparator, the first and second input voltages are supplied to the input ends of the first and second capacitances respectively in ON states of the first, second and third switches. Thereafter the third and fourth input voltages are supplied to the input ends of the first and second capacitances respectively in OFF states of the first and second switches. Then, the third switch is brought into an OFF state after a constant time. Thus, the voltage comparator compares the differential voltage between the first and third input voltages supplied to the input end of the first capacitance with the differential voltage between the second and fourth input voltages supplied to the input end of the second capacitance when the third switch enters an OFF state, so that the first and second output terminals output the results of comparison as complementary output signals.

In this case, the third switch enters an OFF state after a constant time from supply of the third and fourth input voltages, whereby the output terminals output the results of comparison after switching noise substantially disappears. Therefore, the first and second output signals are not influenced by noise but immediately change to states indicating the essential results of comparison. Thus, a voltage comparator which can perform a high-speed operation while eliminating influence by noise is implemented.

The differential amplification circuit may include a first transistor connected between a first power supply potential and the first output terminal, a second transistor connected between the first power supply potential and the second output terminal, a third transistor connected between a second power supply potential and the first output terminal, a fourth transistor connected between the second power supply potential and the second output terminal, and a constant current source interposed in a path between the first power supply potential and the first and second transistors or in a path between the second power supply potential and the third and fourth transistors, while control electrodes of the first and second transistors may be connected to the first and second input terminals respectively.

In this case, the first, second, third and fourth transistors and the constant current source differentially amplify the differential voltage between the first and third input voltages and that between the second and fourth input voltages.

A prescribed bias voltage may be supplied to control electrodes of the third and fourth transistors. Thus, the third and fourth transistors serve as loads.

Alternatively, the differential amplification circuit may include a first transistor connected between a first power supply potential and the first output terminal, a second transistor connected between the first power supply potential and the second output terminal, a third transistor connected between a second power supply potential and the first output terminal, a fourth transistor connected between the second power supply potential and the second output terminal, and a constant current source interposed in a path between the first power supply potential and the first and second transistors or in a path between the second power supply potential and the third and fourth transistors, while control electrodes of the third and fourth transistors may be connected to the first and second input terminals respectively.

In this case, the first, second, third and fourth transistors and the constant current source differentially amplify the differential voltage between the first and third input voltages and that between the second and fourth input voltages.

A prescribed bias voltage may be supplied to control electrodes of the first and second transistors. Thus, the first and second transistors serve as loads.

Each of the first, second and third switches may be a complementary switch formed by a first conductivity type channel transistor and a second conductivity type channel transistor.

Even if switching noise is inputted to the first and second input terminals through parasitic capacitances present in the respective transistors of the complementary switch, the output terminals output the output signals indicating the results of comparison after the switching noise substantially disappears.

The voltage comparator may further comprise a fourth switch connected between the first input terminal and a prescribed voltage source and a fifth switch connected between the second input terminal and the prescribed voltage source, the fourth and fifth switches may be brought into ON states when the third switch is in an ON state, and the fourth and fifth switches may be brought into OFF states when the third switch is in an OFF state.

In this case, a voltage from the voltage source is supplied to the first and second output terminals when the first and second input voltages are inputted in the first and second input terminals, and the first and second output terminals are cutoff from the voltage source after a constant time from supply of the third and fourth input voltages to the first and second input terminals. Thus, the first and second input terminals are kept at the same potential before change of the output signals. Therefore, the output signals stably change with no influence by noise.

An operational amplifier according to a further aspect of the present invention comprises an amplification circuit having first and second output terminals outputting output signals complementary to each other, and a switch substantially shorting the first and second output terminals when noise appears and opening the first and second output terminals after the noise substantially disappears.

This operational amplifier substantially shorts the first and second terminals when noise appears and opens the first and second output terminals after the noise substantially disappears, thereby outputting the complementary output signals indicating results of comparison after the noise substantially disappears.

Therefore, first and second output signals are not influenced by noise but immediately change to states indicating the essential results of comparison. Thus, an operational amplifier which can perform a high-speed operation while eliminating influence by noise is implemented.

An operational amplifier according to a further aspect of the present invention comprises an amplification circuit differentially amplifying first and second input voltages inputted to first and second input terminals respectively and outputting first and second output voltages complementary to each other from first and second output terminals, and a switch substantially shorting the first and second output terminals before the first and second input voltages are inputted to the first and second input terminals and opening the first and second output terminals in a delay by a constant time from supply of the first and second input voltages to the first and second input terminals.

This operational amplifier substantially shorts the first and second output terminals before supply of the first and second input voltages and opens the first and second output terminals in a delay by the constant time from supply of the first and second input voltages, thereby outputting the complementary first and second output voltages indicating the results of comparison after noise appearing in supply of the first and second input voltages substantially disappears.

Therefore, the first and second output signals are not influenced by noise but immediately change to states indicating the essential results of comparison. Thus, an operational amplifier which can perform a high-speed operation while eliminating influence by noise is implemented.

The first input voltage may be a first differential input voltage, and the second input voltage may be a second differential input voltage.

In this case, the operational amplifier substantially shorts the first and second output terminals before supply of the first and second differential input voltages and opens the first and second output terminals in a delay by the constant time from supply of the first and second differential input voltages, thereby outputting the complementary first and second output voltages indicating the results of comparison after noise appearing in supply of the first and second differential input voltages substantially disappears.

Therefore, the first and second output signals are not influenced by noise but immediately change to states indicating the essential results of comparison. Thus, an operational amplifier which can perform a high-speed operation while eliminating influence by noise is implemented.

An analog-to-digital converter according to a further aspect of the present invention comprises a plurality of comparators each comparing an input voltage with at least one referential potential, and each of the plurality of comparators comprises a differential amplification circuit having first and second input terminals and first and second output terminals, a first switch connected between the first input terminal and the first output terminal, a second switch connected between the second input terminal and the second output terminal, a first capacitance connected to the first input terminal, a second capacitance connected to the second input terminal, and a third switch connected between the first output terminal and the second output terminal. The first, second and third switches are brought into ON states while first and second input voltages are supplied to input ends of the first and second capacitances respectively, thereafter the first and second switches are brought into OFF states while third and fourth input voltages are supplied to the input ends of the first and second capacitances respectively, and the third switch is brought into an OFF state after a constant time.

Each comparator is formed by the aforementioned voltage comparator, whereby the analog-to-digital converter can perform a high-speed operation while eliminating influence by noise.

An analog-to-digital conversion circuit according to a further aspect of the present invention has a multistage pipeline structure formed by a plurality of stages, and each of the plurality of stages includes an analog-to-digital converter, a digital-to-analog converter and a differential amplifier. The analog-to-digital converter includes a plurality of comparators each comparing an input voltage with at least one referential potential, a differential amplification circuit having first and second input terminals and first and second output terminals, a first switch connected between the first input terminal and the first output terminal, a second switch connected between the second input terminal and the second output terminal, a first capacitance connected to the first input terminal, a second capacitance connected to the second input terminal, and a third switch connected between the first output terminal and the second output terminal. The first, second and third switches are brought into ON states while first and second input voltages are supplied to input ends of the first and second capacitances respectively, thereafter the first and second switches are brought into OFF states while third and fourth input voltages are supplied to the input ends of the first and second capacitances respectively, and the third switch is brought into an OFF state after a constant time.

This analog-to-digital conversion circuit employing the aforementioned analog-to-digital converter can perform a high-speed operation while eliminating influence by noise. Thus, a high-accuracy analog-to-digital conversion circuit which has a large number of bits and high resolution and can perform a high-speed operation is implemented.

An analog-to-digital conversion circuit according to a further aspect of the present invention has a multistage pipeline structure formed by a plurality of stages, and each of the plurality of stages includes an analog-to-digital converter, a digital-to-analog converter and a differential amplifier. The differential amplifier includes an operational amplifier, which comprises an amplification circuit differentially amplifying first and second input voltages inputted to first and second input terminals respectively and outputting first and second output voltages complementary to each other from first and second output terminals, and a switch substantially shorting the first and second output terminals before the first and second input voltages are inputted to the first and second input terminals and opening the first and second output terminals in a delay by a constant time from supply of the first and second input voltages to the first and second input terminals.

This analog-to-digital conversion circuit employing the aforementioned operational amplifier can perform a high-speed operation while eliminating influence by noise. Thus, a high-accuracy analog-to-digital conversion circuit which has a large number of bits and high resolution and can perform a high-speed operation is implemented.

An operating method of a voltage comparator according to a further aspect of the present invention, which is applied to a voltage comparator comprising a differential amplification circuit having first and second input terminals and first and second output terminals, a first capacitance connected to the first input terminal and a second capacitance connected to the second input terminal, includes steps of substantially shorting the first input terminal and the first output terminal, the second input terminal and the second output terminal and the first and second output terminals respectively while supplying first and second input voltages to input ends of the first and second capacitances respectively, thereafter opening the first input terminal and the first output terminal as well as the second input terminal and the second output terminal while supplying third and fourth input voltages to the input ends of the first and second capacitances respectively, and opening the first and second output terminals after a constant time.

In the operating method of a voltage comparator, the first and second input voltages are first supplied to the input ends of the first and second capacitances respectively in ON states of first, second and third switches. Thereafter the third and fourth input voltages are supplied to the input ends of the first and second capacitances respectively in OFF states of the first and second switches. Then, the third switch is brought into an OFF state after a constant time. Thus, the differential voltage between the first and third input voltages supplied to the input end of the first capacitance is compared with that between the second and fourth input voltages supplied to the input end of the second capacitance when the third switch is brought into an OFF state-, so that the first and second output terminals output the results of comparison as complementary output signals.

In this case, the third switch is brought into an OFF state after the constant time from supply of the third and fourth input voltages, whereby the results of comparison are outputted after switching noise substantially disappears.

Therefore, the first and second output signals are not influenced by noise but immediately change to states indicating the essential results of comparison. Thus, a voltage comparator which can perform a high-speed operation while eliminating influence by noise is implemented.

The operating method of a voltage comparator may further include steps of applying a prescribed voltage to the first and second output terminals when these output terminals are substantially shorted, and cutting off the first and second output terminals from the prescribed voltage when these output terminals are opened.

In this case, a voltage from a voltage source is supplied to the first and second output terminals of the differential amplification circuit when the first and second input voltages are inputted in the first and second input terminals and the first and second output terminals are cut off from the voltage source after the constant time from supply of the third and fourth input voltages to the first and second input terminals. Thus, the first and second output terminals are kept at the same potential before change of the output signals. Therefore, the output signals stably change with no influence by noise.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
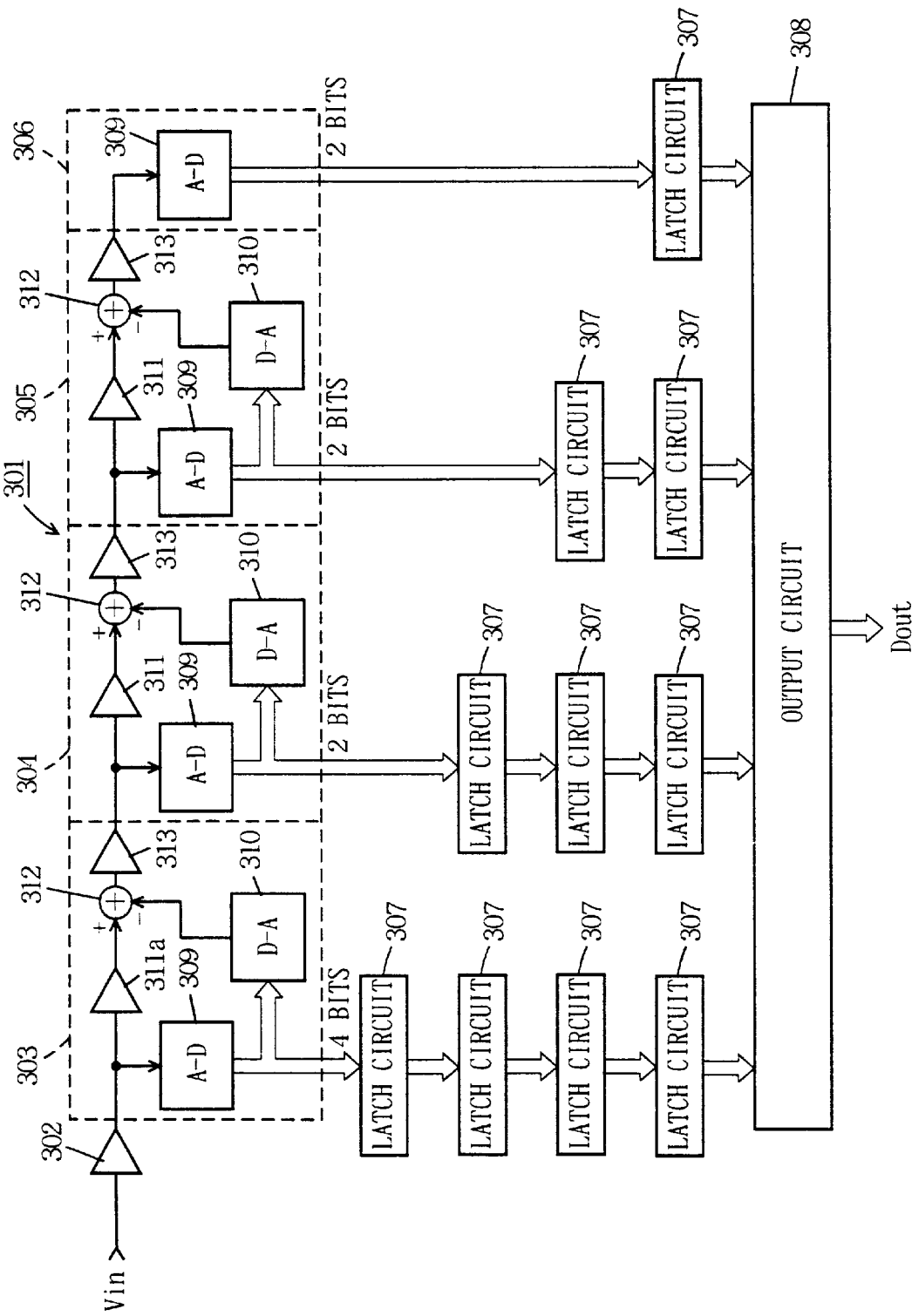
FIG. 1 is a block diagram showing the structure of an analog-to-digital conversion circuit according to an embodiment of the present invention.

FIG. 1 is a block diagram showing the structure of an analog-to-digital conversion circuit 301 according to an embodiment of the present invention. The analog-to-digital conversion circuit 301 shown in FIG. 1 has a 10-bit four-stage pipeline structure.

Referring to FIG. 1, the analog-to-digital conversion circuit 301 includes a sample-and-hold circuit 302, first- to fourth-stage circuits 303 to 306, a plurality of latch circuits 307 and an output circuit 308.

The first-stage (initial stage) circuit 303 comprises a sub A-D converter 309, a D-A converter 310, an operational amplifier 311$a$, a subtraction circuit 312 and another operational amplifier 313. Each of the second- and third-stage circuits 304 and 305 comprises a sub A-D converter 309, a D-A converter 310, an operational amplifier 311, a subtraction circuit 312 and another operational amplifier 313.

As described later, the operational amplifier 311$a$ provided in the first-stage circuit 303 has a gain 1 and serves as a sample-and-hold circuit. The gain of the operational amplifier 313 in each of the first- to third-stage circuits 303 to 305 is 2. The fourth-stage (final stage) circuit 306 comprises only a sub A-D converter 309.

The first-stage circuit 303 has a 4-bit structure, and each of the second- to fourth-stage circuits 304 to 306 has a 2-bit structure. In the first- to third-stage circuits 303 to 305, the sub A-D converters 309 and the D-A converters 310 are set at the same bit numbers (bit structures).

Operations of the analog-to-digital conversion circuit 301 shown in FIG. 1 are now described. The sample-and-hold circuit 302 samples an analog input signal Vin and holds the same for a constant time. The analog input signal Vin outputted from the sample-and-hold circuit 302 is transferred to the first-stage circuit 303.

In the first-stage circuit 303, the sub A-D converter 309 A-D converts the analog input signal Vin. The sub A-D converter 309 transfers the result of A-D conversion, i.e., a high order 4-bit digital output ($2^9$, $2^8$, $2^7$, $2^6$) to the D-A converter 310 while transferring the same to the output circuit 308 through four latch circuits 307. The D-A converter 310 converts the high order 4-bit digital output ($2^9$, $2^8$, $2^7$, $2^6$), i.e., the result of A-D conversion of the sub A-D converter 309, to an analog signal.

On the other hand, the operational amplifier 311$a$ samples the analog input signal Vin and holds the same for a constant time. The subtraction circuit 312 performs subtraction of the analog input signal Vin outputted from the operational amplifier 311$a$ and the result of D-A conversion of the D-A converter 310. The operational amplifier 313 amplifies an output of the subtraction circuit 312. An output of the operational amplifier 313 is transferred to the second-stage circuit 304.

In the second-stage circuit 304, the sub A-D converter 309 A-D converts the output from the operational amplifier 313 of the first-stage circuit 303. The sub A-D converter 309 transfers the result of A-D conversion to the D-A converter 310 while transferring the same to the output circuit 308 20 through three latch circuits 307. Thus, the second-stage circuit 304 provides an intermediate high order 2-bit digital output (25, 24).

On the other hand, the operational amplifier 311 amplifies the output from the operational amplifier 313 of the first-stage circuit 303. The subtraction circuit 312 performs subtraction of an output of the operational amplifier 311 and the result of D-A conversion of the D-A converter 310. The operational amplifier 313 amplifies an output of the subtraction circuit 312. An output of the operational amplifier 313 is transferred to the third-stage circuit 305.

The third-stage circuit 305 performs operations similar to those of the second-stage circuit 304 on the output from the operational amplifier 313 of the second-stage circuit 304. Thus, the third-stage circuit 305 provides an intermediate low order 2-bit digital output ($2^3$, $2^2$).

In the fourth-stage circuit 306, the sub A-D converter 309 A-D converts an output from the operational amplifier 313 of the third-stage circuit 305, to provide a low order 2-bit digital output ($2^1$, $2^0$).

The digital outputs from the first- to fourth-stage circuits 303 to 306 simultaneously reach the output circuit 308 through the respective latch circuits 307. Namely, the latch circuits 307 are adapted to synchronize the digital outputs from the circuits 303 to 306 with each other.

The output circuit 308 outputs a 10-bit digital output Dout of the analog input signal Vin in parallel after digital correction, if necessary.

The conversion speed of the inventive analog-to-digital conversion circuit is now described in comparison with that of a comparative analog-to-digital conversion circuit. The inventive analog-to-digital conversion circuit has the structure shown in FIG. 1, and the comparative analog-to-digital conversion circuit has the structure shown in FIG. 14.

Figure 2:
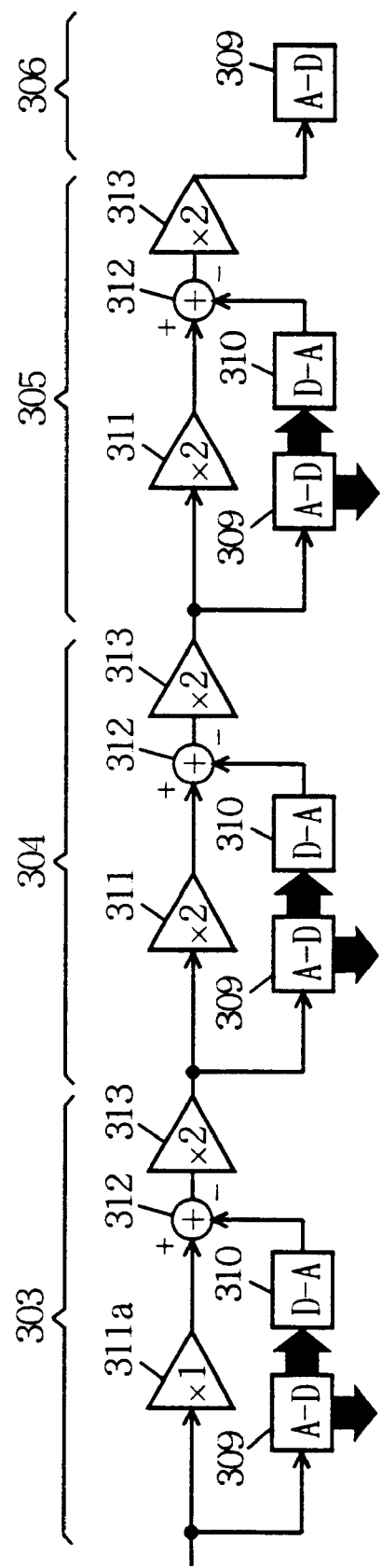
FIG. 2 is a block diagram showing the structure of a principal part of the inventive analog-to-digital conversion circuit.
Figure 3:
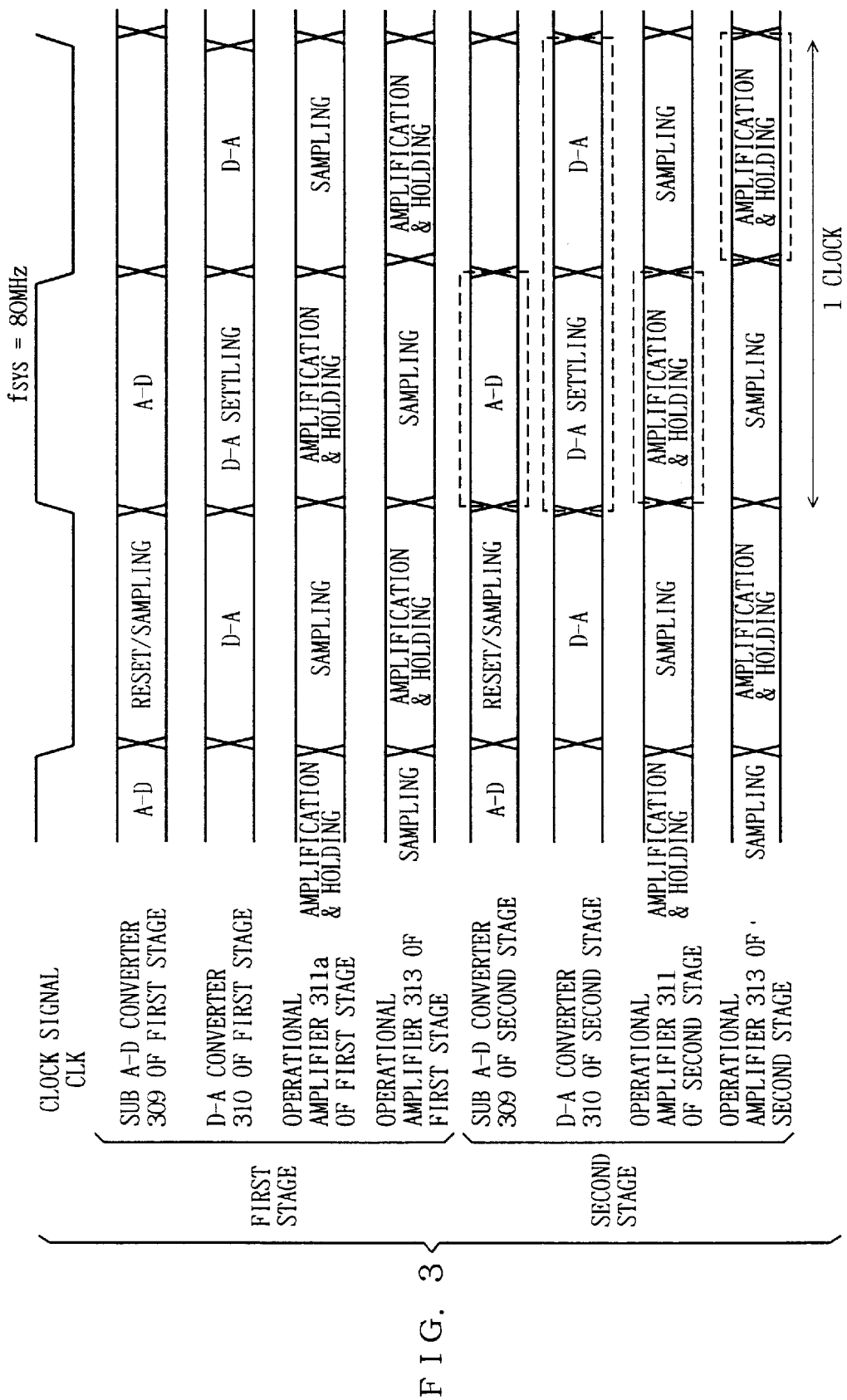
FIG. 3 is a waveform diagram showing operation timings in the analog-to-digital conversion circuit shown in FIG. 2.
Figure 4:
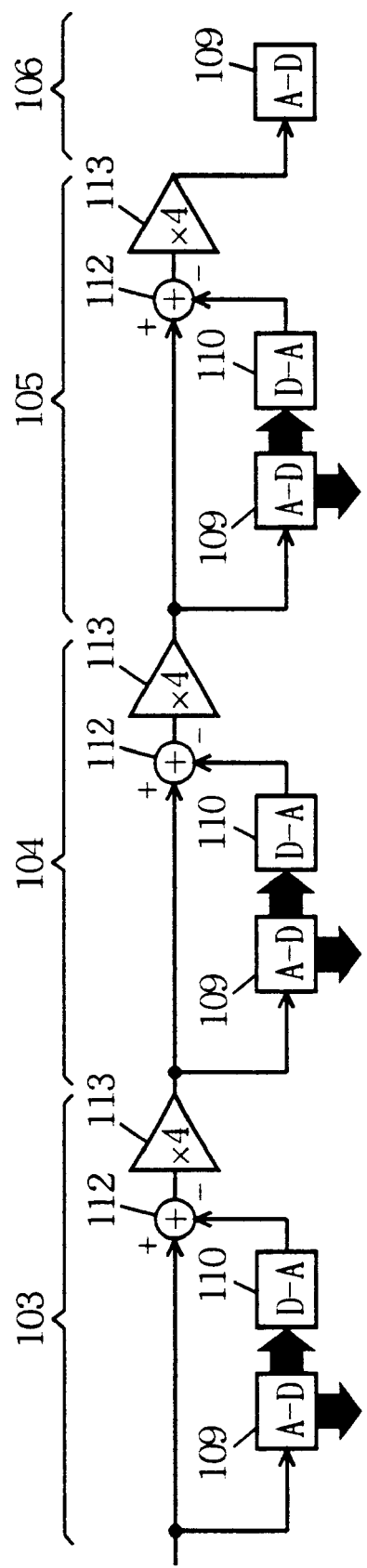
FIG. 4 is a block diagram showing the structure of a principal part of a comparative analog-to-digital conversion circuit.
Figure 5:
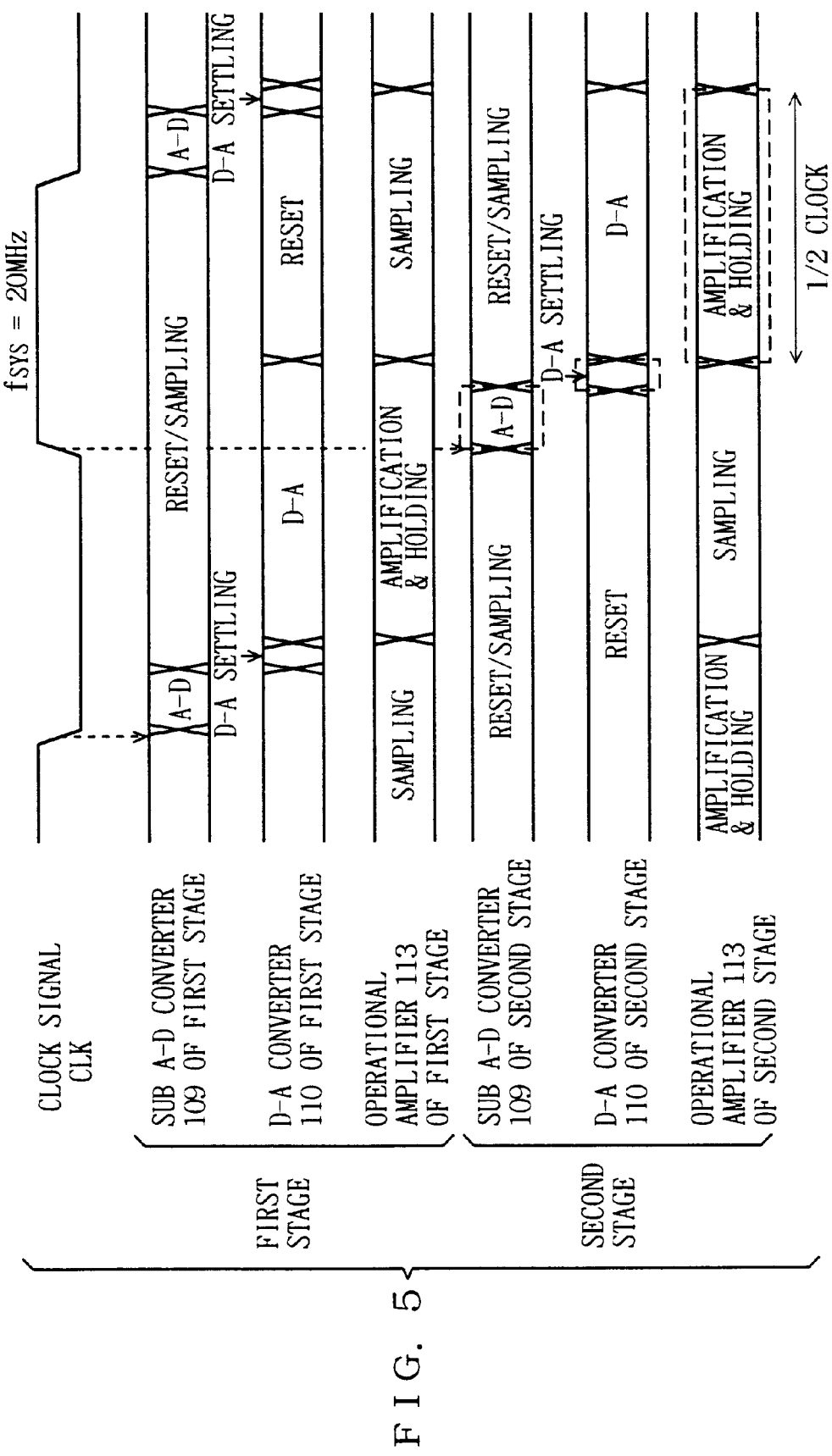
FIG. 5 is a waveform diagram showing operation timings in the analog-to-digital conversion circuit shown in FIG. 4.

FIG. 2 is a block diagram showing the structure of a principal part of the inventive analog-to-digital conversion circuit, and FIG. 3 is a waveform diagram showing operation timings in the analog-to-digital conversion circuit shown in FIG. 2. FIG. 4 is a block diagram showing the structure of a principal part of the comparative analog-to-digital conversion circuit, and FIG. 5 is a waveform diagram showing operation timings in the analog-to-digital conversion circuit shown in FIG. 4.

In the inventive analog-to-digital conversion circuit shown in FIG. 2, the loop constants of the operational amplifiers 311a and 313 in the first-stage circuit 303 are set at 1 and 2 respectively, whiled those of the operational amplifiers 311 and 313 in the second- and third-stage circuits 304 and 305 are set at 2.

Further, the bit number (bit structure) of the sub A-D converter 309 provided in the first-stage circuit 303 is 4, while those of the sub A-D converters 309 in the second- to fourth-stage circuits 304 to 306 are 2.

Figure 14:
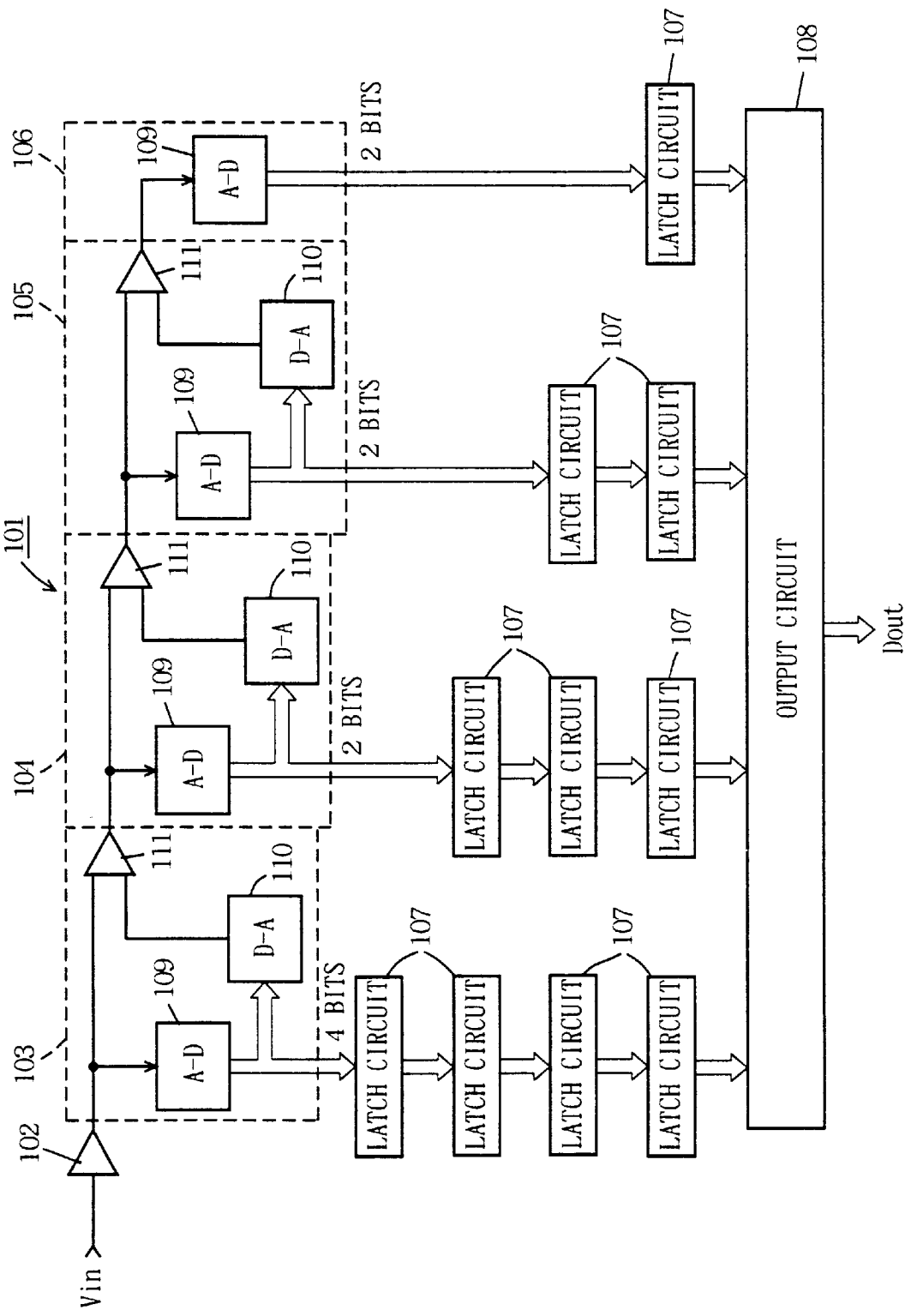
FIG. 14 is a block diagram showing the structure of a conventional analog-to-digital conversion circuit.
Figure 15:
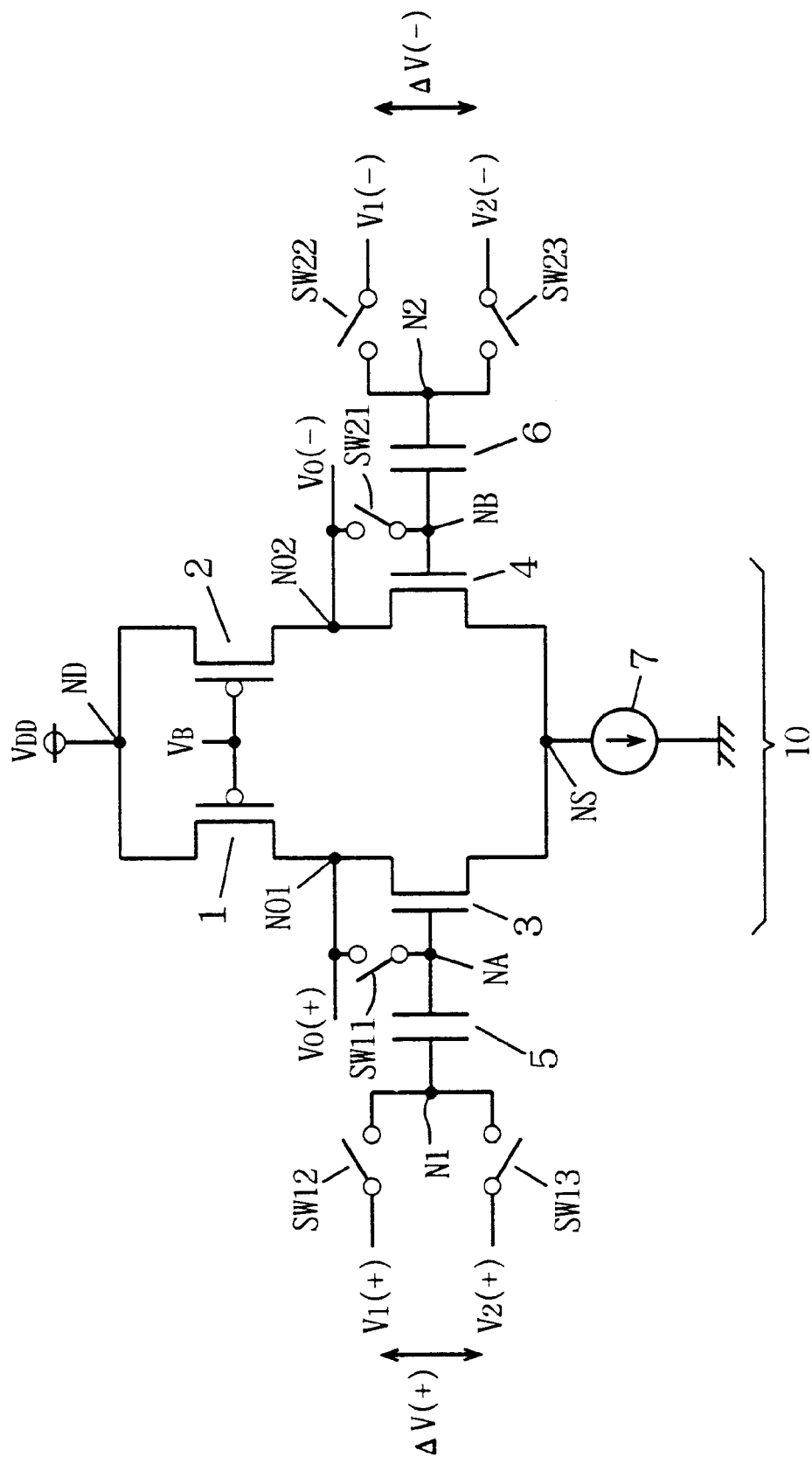
FIG. 15 is a circuit diagram of a conventional differential voltage comparator.
Figure 16:
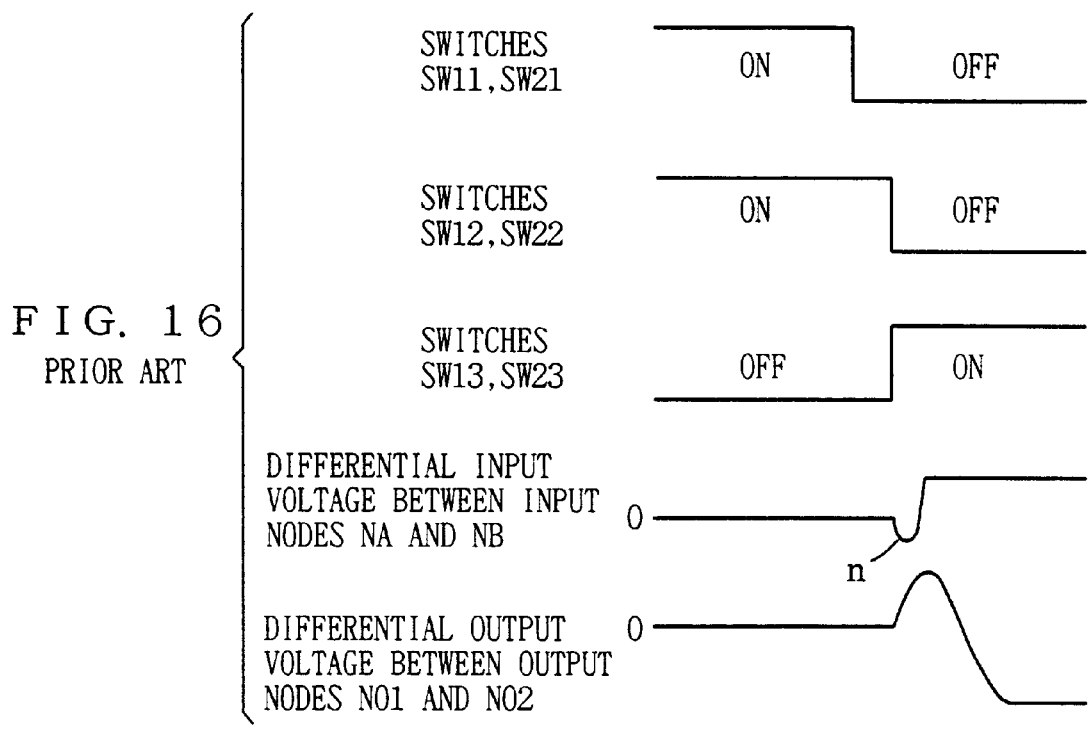
FIG. 16 is adapted to illustrate operations of the differential voltage comparator shown in FIG. 15.

In the comparative analog-to-digital conversion circuit shown in FIG. 4, on the other hand, subtraction circuits 112 and operational amplifiers 113 in first- to third-stage circuits 103 to 105 form the differential amplifier 111 shown in FIG. 14. The loop constants of the operational amplifiers 113 in the first- to third-stage circuits 103 to 105 are set at 4 respectively.

Further, the bit number (bit structure) of the sub A-D converter 109 provided in the first-stage circuit 103 is 4, while those of the sub A-D converters 109 in the second- to fourth-stage circuits 104 to 106 are 2.

In an analog-to-digital conversion circuit of a multistage pipeline structure, a limit operating frequency $f_{SYS}$ is decided through a loop frequency $f_{LOOP}$ of each operational amplifier as follows:

$$f_{SYS} \approx \frac{1}{2} \times f_{LOOP} = \frac{1}{2} \times 1/Ai \times f_{OP} \quad (1)$$

where $f_{OP}$ represents a GB product (gain-bandwidth product) frequency of each operational amplifier, Ai represents the loop constant of each operational amplifier, and ½ represents an operating margin.

From the above expression (1), it is necessary to reduce the loop constant Ai for increasing the limit operating frequency $f_{SYS}$ of the analog-to-digital conversion circuit.

In the comparative analog-to-digital conversion circuit, the loop constant Ai is set at 4. In this case, the GB product frequency $f_{OP}$ of each operational amplifier must be at least 160 MHz, in order to increase the operating frequency $f_{SYS}$ to 20 MHz.

The inventive analog-to-digital conversion circuit having the plurality of stages of operational amplifiers 311a, 311 and 313 in the first- to third-stage circuits 303 to 305 can reduce the loop constant Ai of the operational amplifiers 311a, 311 and 313 without changing the gain per circuit stage.

As hereinabove described, the loop constants Ai of the operational amplifiers 311a and 313 provided in the first-stage circuit 303 are set at 1 and 2 respectively, and those of the operational amplifiers 311 and 313 provided in the second- and third-stage circuits 304 and 305 are set at 2.

In general, a limit speed (GB product) of an operational amplifier for obtaining the same dc gain is as follows:

$$GB\ product \approx gm/CL$$

where CL represents a load capacitance, and gm represents a mutual conductance. Assuming that the mutual conductance gm is constant in the above expression, the limit speed (GB product) of the operational amplifier depends on the load capacitance CL.

Figure 6:
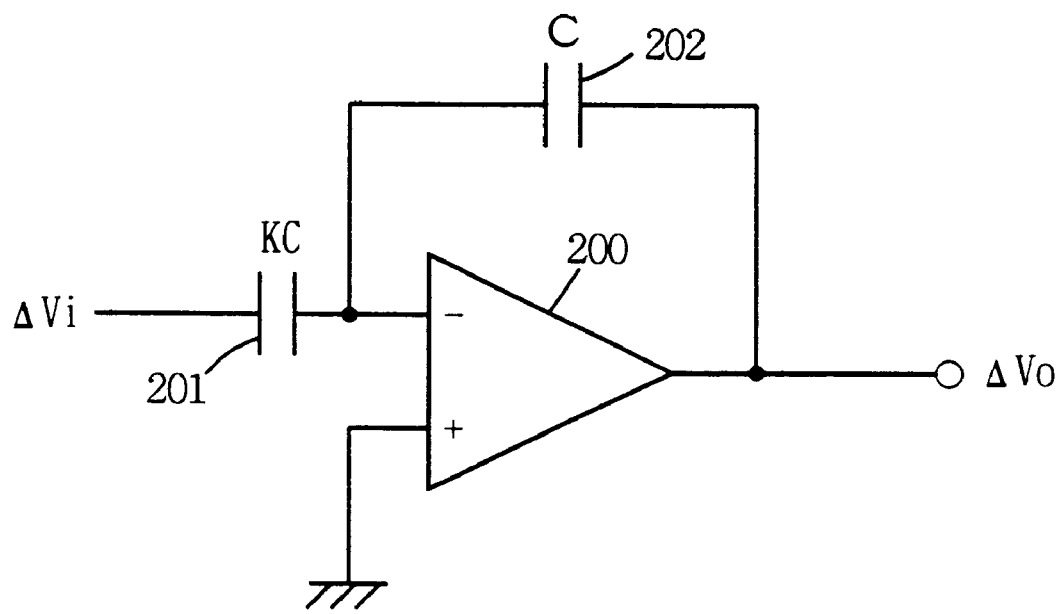
FIG. 6 is a circuit diagram showing the structure of a principal part of an operational amplifier in each of the inventive and comparative analog-to-digital conversion circuits.

FIG. 6 shows the structure of a principal part of each operational amplifier 200 employed for each of the inventive and comparative analog-to-digital conversion circuits. As shown in FIG. 6, a capacitor 201 is connected to an inversion input terminal of the operational amplifier 200, while an output terminal thereof is connected to the inversion input terminal through a capacitor 202.

It is assumed that KC and C represent the capacitance values of the capacitors 201 and 202 respectively. When input voltage change $V_i$ is supplied to an input end of the capacitor 201, output voltage change $\Delta V_o$ is as follows:

$$\Delta V_o = (KC/C) \cdot \Delta V_i = K \cdot \Delta V_i$$

Thus, the input capacitance is increased when the gain K of the operational amplifier is increased. In other words, the input capacitance value of the subsequent operational amplifier is reduced when the gain K of each operational amplifier is reduced, for reducing the load capacitance of each operational amplifier.

In the inventive analog-to-digital conversion circuit, the loop constants Ai of the operational amplifiers 311 and 313 are half those of the operational amplifiers 113 in the comparative analog-to-digital conversion circuit, thereby halving the load capacitances of the operational amplifiers 311a, 311 and 313.

When the operational amplifiers 311a, 311 and 313 have the same performance, therefore, the limit GB product frequency $f_{OPMAX}$ thereof is 320 MHz. Therefore, the loop frequency $f_{LOOP}$ is 160 MHz, and the limit operating frequency $f_{SYS}$ is 80 MHz.

Table 1 shows the speed performance of the inventive and comparative analog-to-digital conversion circuits.

TABLE 1

| | Load Capacitance | $f_{OPMAX}$ | Ai | $f_{LOOP}$ | $f_{SYS}$ |
|---|---|---|---|---|---|
| Comparative Circuit | 1 | 160 MHz | 4 | 40 MHz | 20 MHz |
| Inventive Circuit | 0.5 | 320 MHz | 2 | 160 MHz | 80 MHz |

As shown in Table 1, the limit operating frequency $f_{SYS}$ of the inventive analog-to-digital conversion circuit is 80 MHz, i.e., four times that of the comparative circuit. Therefore, the inventive analog-to-digital conversion circuit obtains a conversion speed of four times that of the comparative circuit.

The inventive analog-to-digital conversion circuit performs the respective operations in synchronization with a clock signal CLK of 80 MHz, as shown in FIG. 3. On the other hand, the comparative analog-to-digital conversion circuit performs the respective operations in synchronization with a clock signal CLK of 20 MHz, as shown in FIG. 5.

In the comparative analog-to-digital conversion circuit, the sub A-D converter 109, the D-A converter 110 and the operational amplifier 113 execute A-D conversion, D-A conversion and amplification and holding within a half clock respectively in the second-stage circuit 104, for example, as shown by broken lines in FIG. 5.

In the inventive analog-to-digital conversion circuit, on the other hand, the sub A-D converter 309 and the operational amplifier 311 perform A-D conversion and amplification and holding at the same timing while the D-A converter 310 and the operational amplifier 313 perform D-A conversion and amplification and holding at the same timing in the second-stage circuit 304, for example, as shown by broken lines in FIG. 3.

In this case, the A-D converter 309, the D-A converter 310 and the operational amplifiers 311 and 313 execute the A-D conversion, the D-A conversion and the amplification and holding respectively within one clock. Therefore, the timings of the sub A-D converter 309 and the D-A converter 310 are relaxed.

Thus, the two-stage operational amplifiers 311a, 311 and 313 are provided in the first- to third-stage circuits 303 to 305 in the analog-to-digital conversion circuit according to the embodiment, whereby the loop constants of the operational amplifiers 311a, 311 and 313 can be reduced while the load capacitances thereof are also reduced. Consequently, the conversion speed can be increased without improving the performance of the operational amplifiers 311a, 311 and 313.

Further, the initial stage circuit 303 has the 4-bit structure and the second- to final stage circuits 304 to 306 are uniformly divided in 2-bit structures respectively, so that the A-D conversion circuit has a 4-2-2-2 structure thereby attaining high conversion accuracy (refer to Japanese Patent Laying-Open No. 9-69776 (1997), for example).

While the gain of the operational amplifier 311a provided in the initial stage circuit 303 is 1 in the aforementioned structure, the operational amplifier 311a may have a gain of 2, similarly to the remaining operational amplifiers 311.

While each of the first- to third-stage circuits 303 to 305 is provided with two stages of operational amplifiers 311a or 311 and 313 in the aforementioned embodiment, each circuit may alternatively be provided with three or more stages of operational amplifiers.

Figure 7:
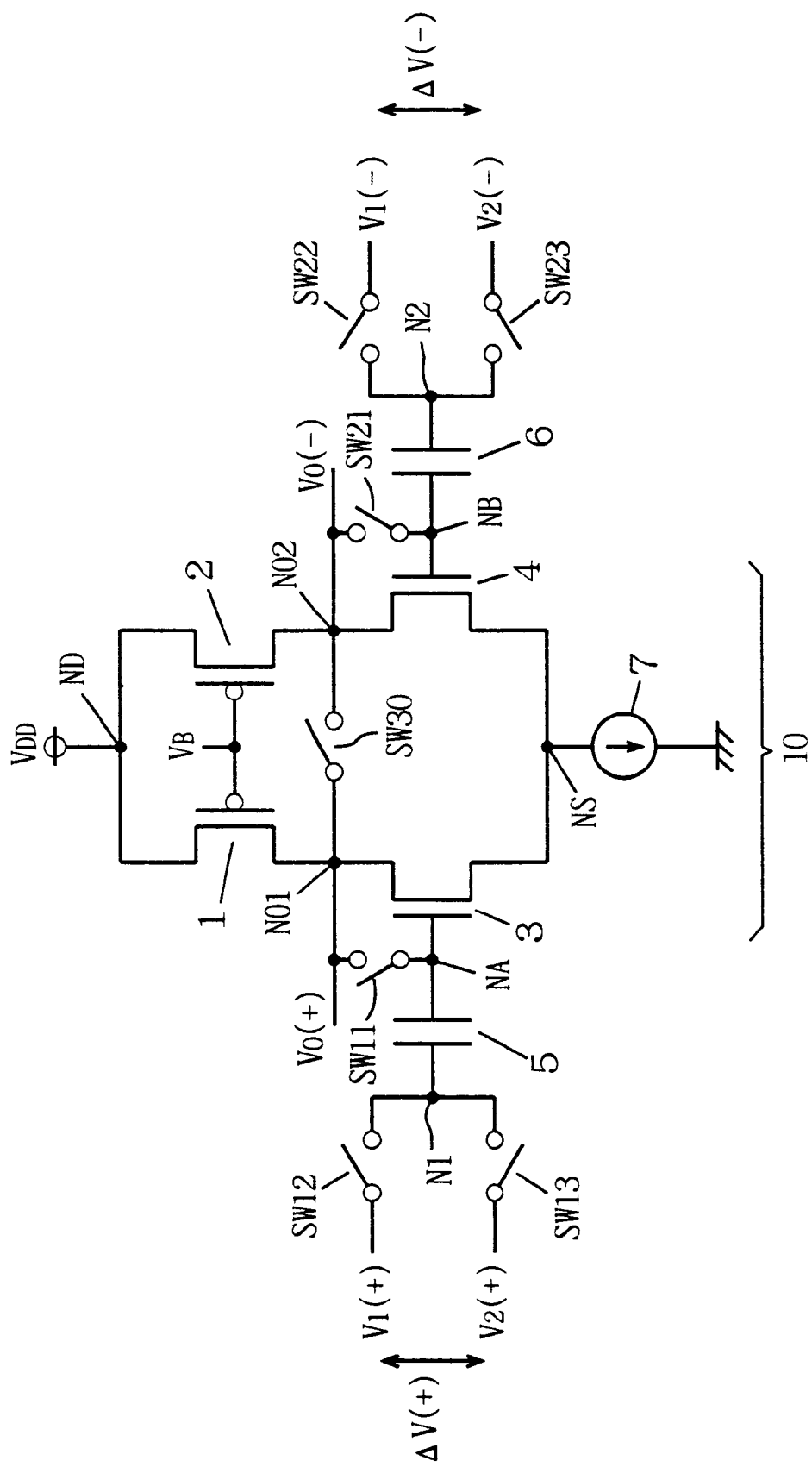
FIG. 7 is a circuit diagram showing a differential voltage comparator according to another embodiment of the present invention.

FIG. 7 is a circuit diagram of a differential voltage comparator according to another embodiment of the present invention.

Referring to FIG. 7, a differential amplification circuit 10 includes formed by P-channel MOS field-effect transistors (hereinafter referred to as PMOS transistors) 1 and 2, N-channel MOS field-effect transistors (hereinafter referred to as NMOS transistors) 3 and 4 and a constant current source 7. In general, an NMOS transistor of a saturated operation is employed for the constant current source 7.

The PMOS transistors 1 and 2 are connected between a node ND and output nodes NO1 and NO2 respectively. The NMOS transistors 3 and 4 are connected between the output nodes NO1 and NO2 and a node NS respectively.

The node ND is supplied with a power supply voltage $V_{DD}$, and the node NS is grounded through the constant current source 7. A bias voltage $V_B$ is supplied to gates of the PMOS transistors 1 and 2. Gates of the NMOS transistors 3 and 4 are connected to input nodes NA and NB respectively.

The input nodes NA and NB are connected to nodes N1 and N2 through capacitors 5 and 6 respectively. Switches SW11 and SW21 are connected between the input nodes NA and NB and the output nodes NO1 and NO2 respectively. Switches SW12 and SW13 are connected in parallel with the node N1, while switches SW22 and SW23 are connected in parallel with the node N2.

Figure 17:
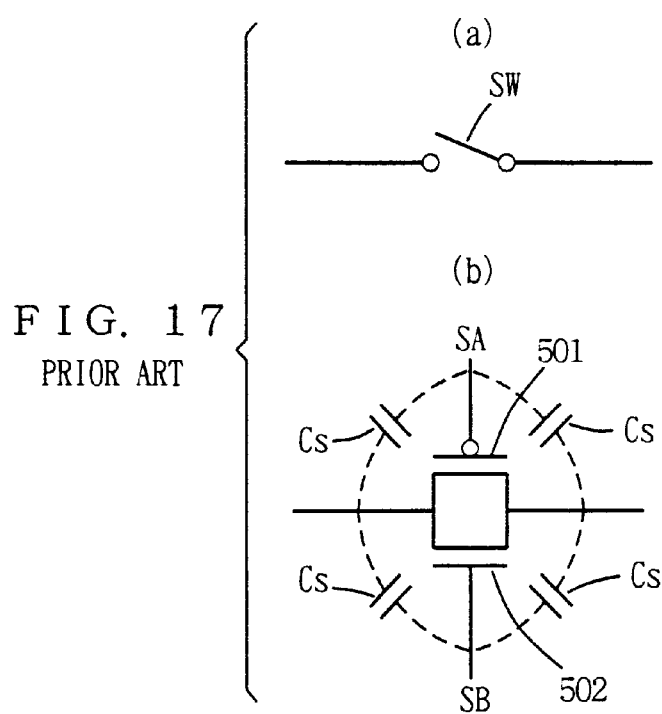
FIGS. 17($a$) and 17($b$) are circuit diagrams showing the structure of a CMOS switch.

Particularly in the differential voltage comparator according to this embodiment, a switch SW30 is connected between the output nodes NO1 and NO2. Each of the switches SW11 to SW13, SW21 to SW23 and SW30 is formed by a CMOS switch similar to that shown in FIGS. 17(a) and 17(b).

Input voltages $V_1(+)$ and $V_2(+)$ are supplied to input ends of the switches SW12 and SW13 respectively, while input voltages $V_1(-)$ and $V_2(-)$ are supplied to input ends of the switches SW22 and SW23 respectively. Output voltages $V_o(+)$ and $V_o(-)$ are derived from the output nodes NO1 and NO2 respectively.

Figure 8:
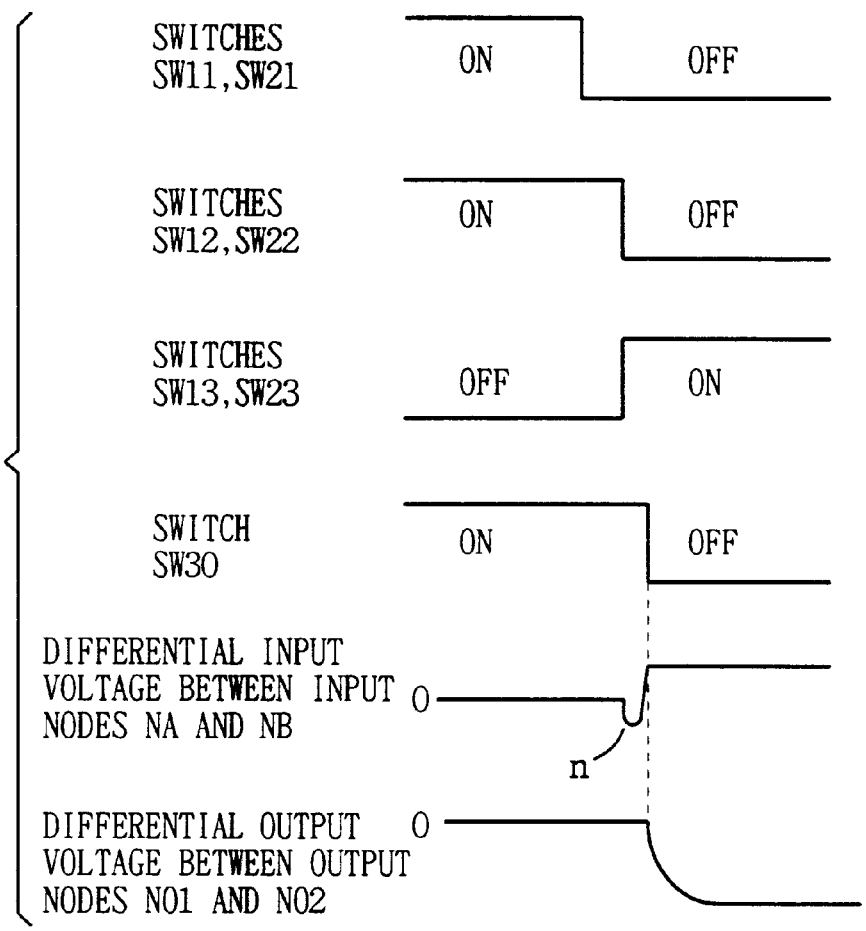
FIG. 8 is adapted to illustrate operations of the differential voltage comparator shown in FIG. 7.

FIG. 8 is adapted to illustrate operations of the differential voltage comparator shown in FIG. 7.

First, the switches SW11, SW21, SW12 and SW22 are moved to ON and the switches SW13 and SW23 are moved to OFF, while the switch SW30 is moved to ON. At this time, the differential input voltage between the input nodes NA and NB as well as that between the output nodes NO1 and NO2 are 0 V.

Then, the switches SW11 and SW21 are moved to OFF, and thereafter the switches SW12 and SW22 are moved to OFF and the switches SW13 and SW23 are moved to ON respectively. Thus, the voltage of the input node NA changes to $V_2(+)-V_1(+)$, and that of the input node NB changes to $V_2(-)-V_1(-)$. The difference between the input voltages $V_1(+)$ and $V_2(+)$ is referred to as a differential input voltage $\Delta V(+)$, and that between the input voltages $V_1(-)$ and $V_2(-)$ is referred to as a differential input voltage $\Delta V(-)$.

Noise n resulting from switching noise of the switches SW12, SW13, SW22 and SW23 is transiently caused in the differential input voltage between the input nodes NA and NB. The switch SW30 is moved to OFF after a lapse of a constant time corresponding to the time of generation of the noise n. At this point of time, one of the output voltages $V_o(+)$ and $V_o(-)$ from the output nodes NO1 and NO2 changes toward the power supply voltage $V_{DD}$ and the remaining one changes toward the ground potential on the basis of the result of comparison of the differential input voltages $\Delta V(+)$ and $\Delta V(-)$ of the input nodes NA and NB. Thus, the differential output voltage between the output nodes NO1 and NO2 changes to a positive or negative side from 0 V on the basis of the result of comparison.

In this case, the differential output voltage between the output nodes NO1 and NO2 immediately changes to a state indicating the result of comparison with no influence by the noise n, whereby no standby time is required for stabilizing the differential output voltage from the state based on the noise n to that indicating the result of comparison, and the result of comparison can be obtained in a short time. Thus, the differential voltage comparator according to this embodiment can perform a high-speed operation while eliminating influence by noise by delaying the output timing for the result of comparison by a slight time corresponding to that generating the noise n. In this case, the differential voltage comparator may output the result of comparison after the noise n substantially disappears.

Figure 9:
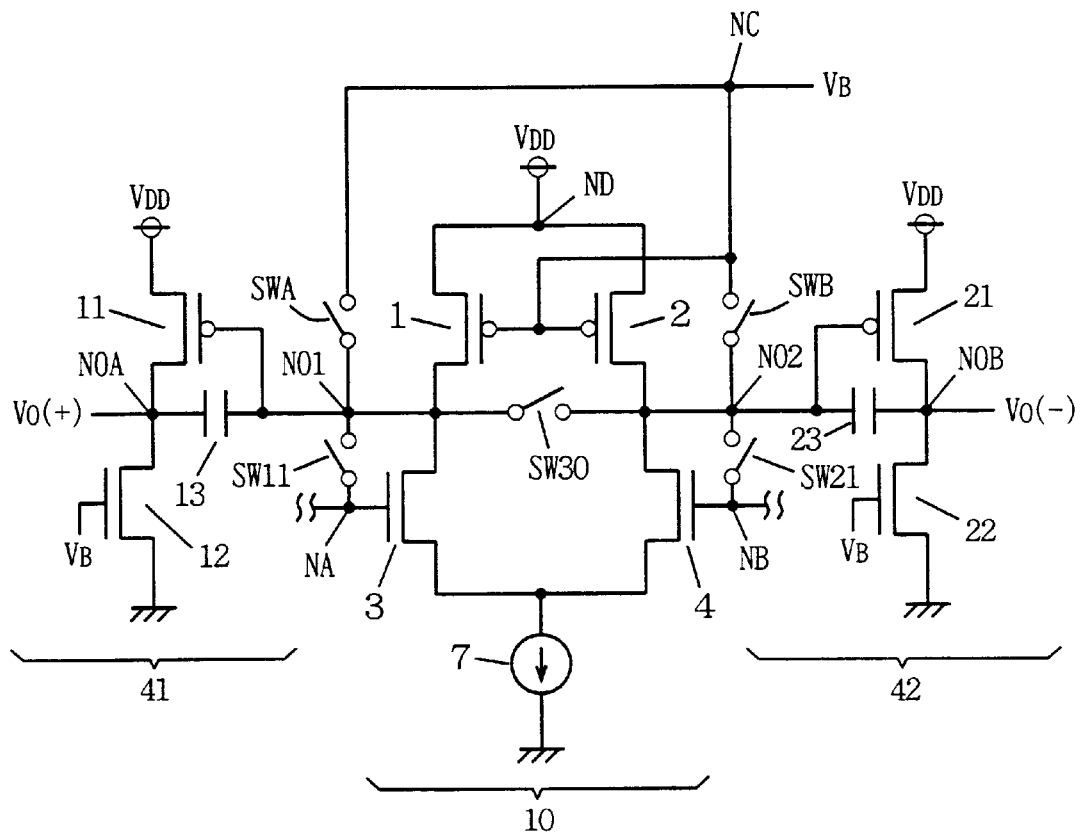
FIG. 9 is a circuit diagram showing an operational amplifier according to still another embodiment of the present invention.

FIG. 9 is a circuit diagram of an operational amplifier according to still another embodiment of the present invention.

In the operational amplifier shown in FIG. 9, output circuits 41 and 42 are connected to output nodes NO1 and NO2 similar to those of the differential voltage comparator shown in FIG. 7 respectively. FIG. 9 omits illustration of capacitors 5 and 6 which are connected to input nodes NA and NB and switches SW12, SW13, SW22 and SW23.

The output circuit 41 is formed by a PMOS transistor 11, an NMOS transistor 12 and a capacitor 13. The PMOS transistor 11 is connected between a power supply voltage $V_{DD}$ and an output node NOA, while the NMOS transistor 12 is connected between the output node NOA and a ground potential. The capacitor 13 is connected between the output nodes NO1 and NOA. A gate of the PMOS transistor 11 is connected to the output node NO1, and that of the NMOS transistor 12 is supplied with a bias voltage $V_B$.

The output circuit 42 is formed by a PMOS transistor 21, an NMOS transistor 22 and a capacitor 23. The PMOS transistor 21 is connected between the power supply voltage $V_{DD}$ and an output node NOB, while the NMOS transistor 22 is connected between the output node NOB and the ground potential. The capacitor 23 is connected between the output node NOB and the ground potential. A gate of the PMOS transistor 21 is connected to the output node NO2, and that of the NMOS transistor 22 is supplied with the bias voltage $V_B$.

The output node NOA of the output circuit 41 outputs an output voltage VO(+), and the output node NOB of the output circuit 42 outputs an output voltage VO(−).

Further, the output nodes NO1 and NO2 are connected to a node NC through switches SWA and SWB respectively. The gates of the PMOS transistors 1 and 2 are connected to the node NC, which is supplied with the bias voltage $V_B$.

Figure 10:
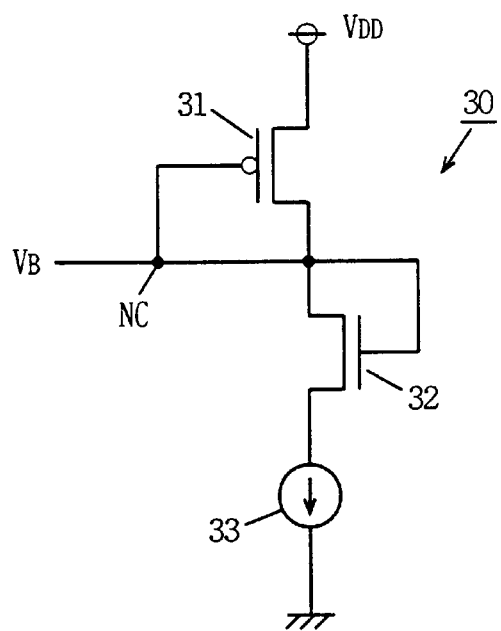
FIG. 10 is a circuit diagram of a bias voltage generation circuit.

FIG. 10 is a circuit diagram of a bias voltage generation circuit 30. The bias voltage generation circuit 30 shown in FIG. 10 is formed by a PMOS transistor 31, an NMOS transistor 32 and a constant current source 33. The PMOS transistor 31 is connected between the power supply voltage $V_{DD}$ and the node NC. The node NC is grounded through the NMOS transistor 32 and the constant current source 33. Gates of the PMOS transistor 31 and the NMOS transistor 32 are connected to the node NC. The node NC outputs the bias voltage $V_B$.

Figure 11:
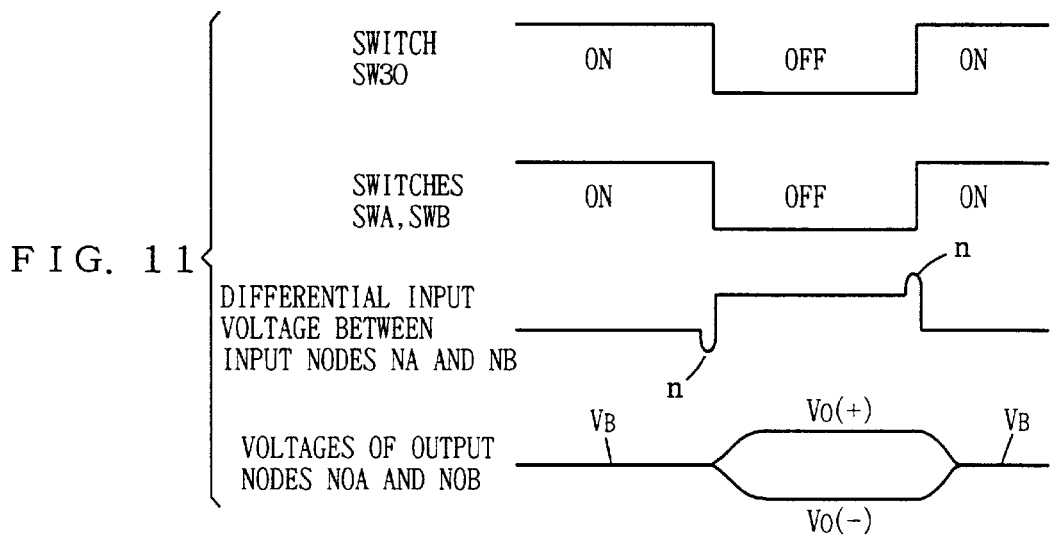
FIG. 11 is adapted to illustrate operations of the operational amplifier shown in FIG. 9.

FIG. 11 is adapted to illustrate operations of the operational amplifier shown in FIG. 9. In the operational amplifier shown in FIG. 9, operations of a part corresponding to the differential voltage comparator shown in FIG. 7 are similar to those shown in FIG. 8.

As shown in FIG. 11, the switch SW30 is first moved to ON. At this time, the switches SWA and SWB are also moved to ON. Thus, the bias voltage $V_B$ is applied to the output nodes NO1 and NO2.

Then, the switch SW30 is moved to OFF. At the same time, the switches SWA and SWB are also moved to OFF. Thus, the output voltages VO(+) and VO(−) of the output nodes NOA and NOB change to positive or negative sides on the basis of the differential input voltage between the input nodes NA and NB.

Thereafter the switch SW30 is moved to ON. At the same time, the switches SWA and SWB are also moved to ON. Thus, the bias voltage $V_B$ is applied to the output nodes NO1 and NO2.

Thus, the output voltages VO(+) and VO(−) change after the noise n resulting from switching noise of the switches SW12, SW13, SW22 and SW23 (see FIG. 7) disappears in the operational amplifier according to this embodiment, whereby the result of amplification is obtained in a short time.

Further, the output nodes NO1 and NO2 are kept at the bias voltage $V_B$ before outputting the result of amplification, whereby the output voltages VO(+) and VO(−) stably change with no influence by noise. Thus, a high-speed operation is enabled while eliminating influence by noise.

Figure 12:
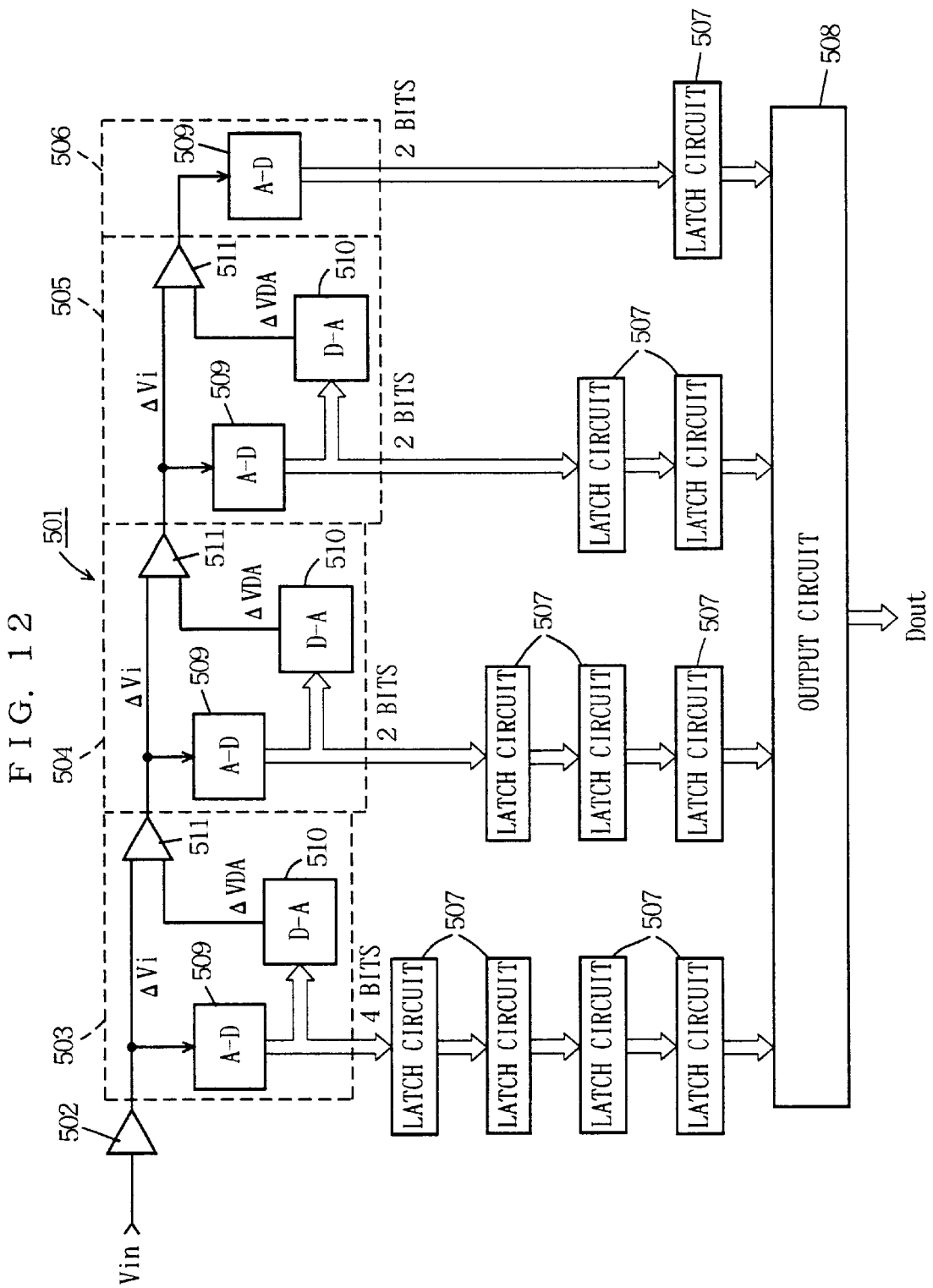
FIG. 12 is a block diagram showing the structure of an analog-to-digital conversion circuit having a multistage pipeline structure according to a further embodiment of the present invention.

FIG. 12 is a block diagram showing the structure of an analog-to-digital conversion circuit 501 according to a further embodiment of the present invention. The analog-to-digital conversion circuit 501 shown in FIG. 12 has a 10-bit four-stage pipeline structure.

Referring to FIG. 12, the analog-to-digital conversion circuit 501 includes a sample-and-hold circuit 502, a first-stage circuit 503, a second-stage circuit 504, a third-stage circuit 505, a fourth-stage circuit 506, a plurality of latch circuits 507 and an output circuit 508.

Each of the first-stage (initial stage) to third-stage circuits 503 to 505 comprises a sub A-D converter 509, a D-A converter 510 and a differential amplifier 511. The differential amplifier 511 is prepared from an operational amplifier identical to that according to the second embodiment. The fourth-stage (final stage) circuit 506 comprises only a sub A-D converter 509.

The first-stage circuit 503 has a 4-bit structure, and each of the second- to fourth-stage circuits 504 to 506 has a 2-bit structure. In the first- to third-stage circuits 503 to 505, the sub A-D converters 509 and the D-A converters 510 are set at the same bit number (bit structure) n.

Operations of the analog-to-digital conversion circuit 501 are now described. The sample-and-hold circuit 502 samples an analog input signal Vin and holds the same for a constant time. The analog input signal Vin outputted from the sample-and-hold circuit 502 is transferred to the first-stage circuit 503.

In the first-stage circuit 503, the sub A-D converter 509 A-D converts the analog input signal Vin. The sub A-D converter 509 transfers the result of A-D conversion, i.e., a high order 4-bit digital output ($2^9$, $2^8$, $2^7$, $2^6$) to the D-A converter 510 while transferring the same to the output circuit 508 through four latch circuits 507. The differential amplifier 511 amplifies the difference between the result of D-A conversion of the D-A converter 510 and the analog input signal Vin. The differential amplifier 511 transfers its output to the second-stage circuit 504.

The second-stage circuit 504 performs operations similar to those of the first-stage circuit 503 on the output from the differential amplifier 511 of the first-stage circuit 503. The third-stage circuit 505 performs operations similar to those of the first-stage circuit 503 on an output from the differential amplifier 511 of the second-stage circuit 504. The second-stage circuit 504 provides an intermediate high order 2-bit digital output ($2^5$, $2^4$), while the third-stage circuit 505 provides an intermediate low order 2-bit digital output ($2^3$, $2^2$).

In the fourth-stage circuit 506, the sub A-D converter 509 A-D converts an output from the differential amplifier 511 of the third-stage circuit 505, to provide a low order 2-bit digital output ($2^1$, $2^0$).

The digital outputs from the first- to fourth-stage circuits 503 to 506 simultaneously reach the output circuit 508 through the respective latch circuits 507. In other words, the latch circuits 507 are adapted to synchronize the digital outputs from the circuits 503 to 506 with each other.

The output circuit 508 outputs a 10-bit digital output Dout of the analog input signal Vin in parallel after digital correction, if necessary.

Thus, in each of the first- to third-stage circuits 503 to 505 of the analog-to-digital conversion circuit 501, the differential amplifier 511 amplifies the difference between the analog input signal Vin or the output of the differential amplifier 511 of the precedent circuit 503 or 504 and the result of D-A conversion of its digital output.

Even if the number of converted bits is increased to reduce the least significant bit (LSB), therefore, the resolution of each sub A-D converter 509 can be substantially improved for attaining sufficient conversion accuracy.

Figure 13:
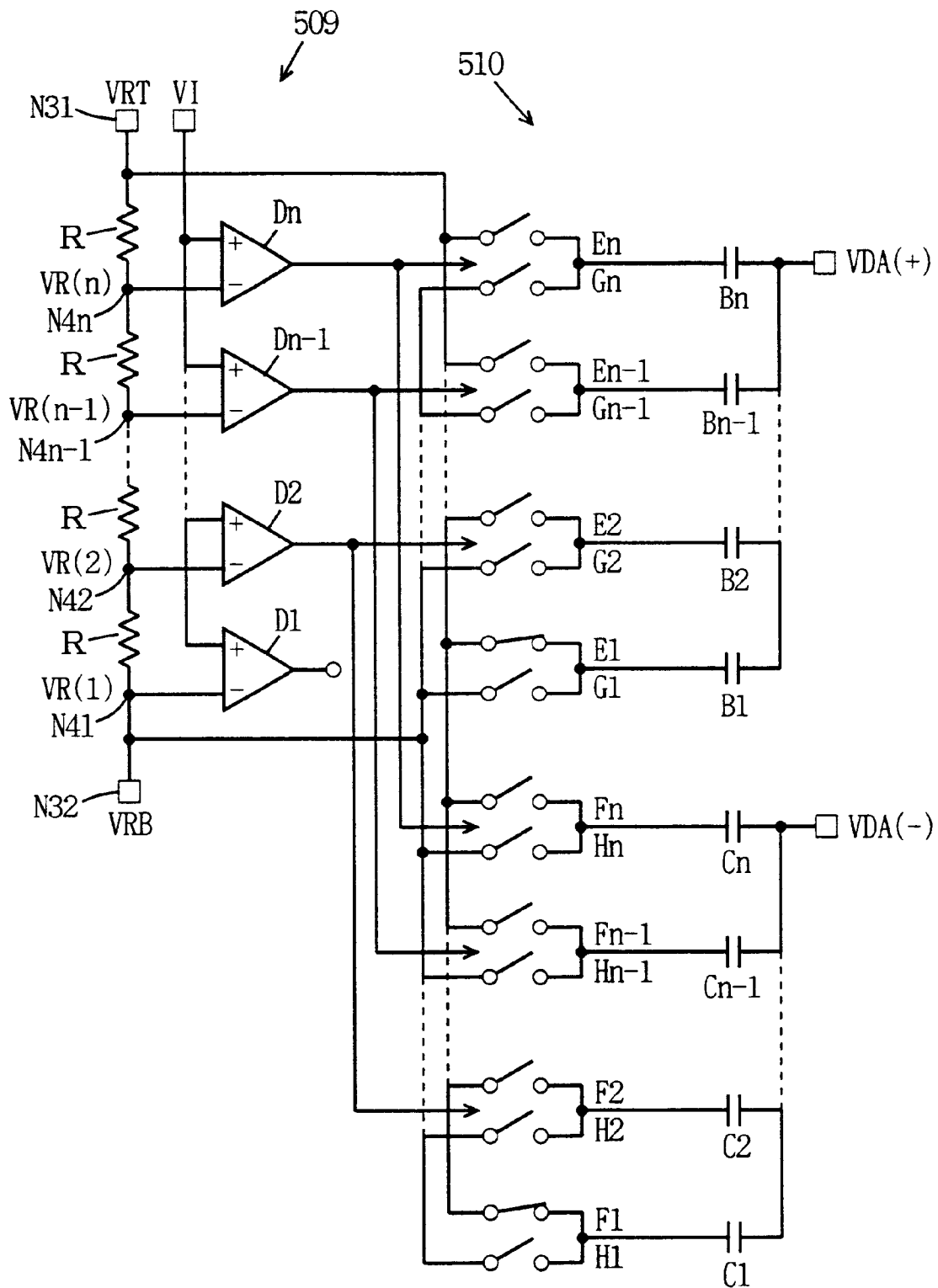
FIG. 13 is a circuit diagram of a sub A-D converter and a D-A converter in the analog-to-digital conversion circuit shown in FIG. 12.

FIG. 13 is a circuit diagram of each sub A-D converter 509 and each D-A converter 510 in the analog-to-digital conversion circuit 501 shown in FIG. 13. The sub A-D converter 509 and the D-A converter 510 shown in FIG. 13 are a total parallel comparison (flush) system sub A-D converter and a capacitance array system D-A converter respectively.

The sub A-D converter 509 includes n resistances R and n comparators C1 to Dn. Each of the comparators D1 to Dn is prepared from a differential voltage comparator identical to that shown in FIG. 7.

All resistors R have the same resistance value and are serially connected between a node N31 receiving a high-potential side reference voltage VRT and a node N32 receiving a low-potential side reference voltage VRB. It is assumed that nodes N41 to N4n between the n resistors R connected between the nodes N32 and N31 have potentials VR(1) to VR(n) respectively.

An input signal VI (the analog input signal Vin or the output from the differential amplifier 511 of the precedent circuit 503, 504 or 505) is inputted in positive input terminals of the comparators D1 to Dn. The potentials VR(1) to VR(n) of the nodes N41 to N4n are applied to negative input terminals of the comparators D1 to Dn respectively.

Thus, outputs of the comparators D1 to Dn go high if the input signal VI is higher than the potentials VR(1) to VR(n), or go low when the input signal VI is lower than the potentials VR(1) to VR(n).

The D-A converter 510 includes n switches E1 to En, F1 to Fn, G1 to Gn and H1 to Hn which are connected in the form of an array, n positive capacitors B1 to Bn and n negative capacitors C1 to Cn.

All capacitors B1 to Bn and C1 to Cn have the same capacitance value c. A differential positive output voltage VDA(+) is formed from first terminals (hereinafter referred to as output terminals) of the capacitors B1 to Bn, while a differential negative output voltage VDA(−) is formed from first terminals (hereinafter referred to as output terminals) of the capacitors C1 to Cn. Second terminals of the capacitors B1 to Bn and C1 to Cn are referred to as input terminals.

First and second terminals of the switches E1 to En are connected to the node N31 and the input terminals of the capacitors B1 to Bn respectively. First and second terminals of the switches F1 to Fn are connected to the node N31 and the input terminals of the capacitors C1 to Cn respectively. First and second terminals of the switches G1 to Gn are connected to the node N32 and the input terminals of the capacitors B1 to Bn respectively. First and second terminals of the switches H1 to Hn are connected to the node N32 and the input terminals of the capacitors C1 to Cn respectively.

The switches E1 to En, F1 to Fn, G1 to Gn and H1 to Hn form four series of switches. For example, the switches E1, F1, G1 and H1 are a series of switches, and the switches En, Fn, Gn and Hn are another series of switches. The switches E1 to En, F1 to Fn, G1 to Gn and H1 to Hn are turned on or off in accordance with output levels of the comparators D1 to Dn respectively. For example, the switches En and Hn are moved to ON and the switches Gn and Fn are moved to OFF when the output of the comparator Dn is at a high level. When the output of the comparator Dn is at a low level, on the other hand, the switches En and Hn are moved to OFF and the switches Gn and Fn are moved to ON.

The output of the comparator D1 forming the sub A-D converter 509 is in an open state. The switches E1 and F1 are fixed in ON states at a prescribed timing, and the switches G1 and H1 are fixed in OFF states at a prescribed timing.

The voltage of the input signal VI for the sub A-D converter 509 is in the range between the high-potential side reference voltage VRT and the low-potential side reference voltage VRB. In other words, the input signal VI for the sub A-D converter 509 never falls below the low-potential side reference voltage VRB. Therefore, the output of the comparator D1 necessarily goes high. Thus, the switches E1, G1, F1 and H1 can be fixed in OFF states at prescribed timings regardless of the output of the comparator D1.

Operations of the D-A converter 510 are now described. Under initial conditions, the potentials of the input and output terminals of the capacitors B1 to Bn are 0 V, and all switches E1 to En, F1 to Fn, G1 to Gn and H1 to Hn are in OFF states. Under the initial conditions, therefore, the quantity Q1 of charges (electricity) stored in all capacitors B1 to Bn and C1 to Cn is zero.

When outputs from m ones of the n comparators D1 to Dn go high, m and (n−m) ones of the switches E1 to En enter ON and OFF states respectively, while (n−m) and m ones of the switches G1 to Gn enter ON and OFF states respectively. In accordance with such ON-OFF operations of the switches E1 to En, the quantity Q2 of charges stored in all capacitors B1 to Bn is expressed as follows:

$$Q2 = m(VRT - VDA(+))c + (n-m)(VRB - VDA(+))c \quad (A1)$$

From the principle of conservation of charge, Q1=Q2. Hence, the differential positive output voltage VDA(+) is expressed as follows:

$$VDA(+) = VRB + m(VRT - VRB)/n \quad (A2)$$

When the outputs of m ones of the n comparators D1 to Dn go high, m and (n−m) ones of the switches H1 to Hn enter ON and OFF states respectively, while (n−m) and m ones of the switches F1 to Fn enter ON and OFF states respectively. In accordance with such ON-OFF operations of the switches H1 to Hn and F1 to Fn, the quantity Q3 of charges stored in all capacitors C1 to Cn is expressed as follows:

$$Q3 = (n-m)(VRT - VDA(-))c + m(VRB - VDA(-))c \quad (A3)$$

From the principle of conservation of charge, Q1=Q3. Hence, the differential negative output voltage VDA(−) is expressed as follows:

$$VDA(-) = VRB - (m-1)(VRT - VRB)/n \quad (A4)$$

Hence, from the above expressions (A2) and (A4), a differential voltage ΔVDA is expressed as follows:

$$\Delta VDA = VDA(+) - VDA(-) = VRB - VRT + (m-1)(VRT - VRB)/n - (VRT - VRB)/n \quad (A5)$$

The analog-to-digital conversion circuit 501 according to this embodiment, employing differential voltage comparators identical to that shown in FIG. 7 as the comparators D1 to Dn of each sub A-D converter 509 while employing operational amplifiers identical to that shown in FIG. 9 as the differential amplifiers 511 of the respective stages, can perform a high-speed operation while eliminating influence by noise. Thus, an analog-to-digital conversion circuit having a large bit number and high resolution, which can perform a high-speed operation in high accuracy is implemented.

While the comparators D1 to Dn compare the input signal VI with a plurality of reference potentials in the sub A-D converter 509 shown in FIG. 13, the inventive voltage comparator is also applicable to the case of comparing an input signal with at least one reference potential.

While the voltage comparator according to the present invention is applied to an analog-to-digital conversion circuit of a multistage pipeline structure in the aforementioned embodiment, the inventive voltage comparator is also applicable to a $\Delta\Sigma$ (delta-sigma) or sequential comparison analog-to-digital conversion circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An analog-to-digital conversion circuit comprising:

a plurality of stages of circuits, said circuit of each stage including an analog-to-digital converter, a digital-to-analog converter, a subtraction circuit, and operational amplifiers provided in a plurality of stages, wherein each stage of said operational amplifiers provided in said plurality of stages in at least second and higher stages of said circuits has a function of holding input data, and the gain thereof is set to exceed 1.

2. The analog-to-digital conversion circuit in accordance with claim 1, wherein said plurality of stages of circuits are in a multistage pipeline structure.

3. The analog-to-digital conversion circuit in accordance with claim 1, wherein an output of a precedent operational amplifier of said plurality of stages of operational amplifiers in each stage of said circuits is supplied to said subtraction circuit in the same stage of said circuits, and an output of a subsequent operational amplifier of said plurality of stages of operational amplifiers in each stage of said circuits is supplied to said analog-to-digital converter and said operational amplifier in the subsequent stage of said circuits.

4. An analog-to-digital conversion circuit have a multistage pipeline structure formed by a plurality of stages of circuits, wherein each stage of said circuits excluding the final stage of said circuits includes:

an analog-to-digital converter converting an input analog signal to a digital signal, a first amplifying circuit including at least one stage of first operational amplifier amplifying an input analog signal, a digital-to-analog converter converting a digital signal outputted from said analog-to-digital converter to an analog signal, a subtraction circuit performing subtraction of an analog signal outputted from said first amplifying circuit and an analog signal output from said digital-to-analog converter, and a second amplifying circuit including at least one stage of second operational amplifier amplifying an analog signal output from said subtraction circuit, wherein said first operational amplifier and said second operational amplifier in at least second and higher stages of said circuits have a function of holding input data, and the gain thereof is set to exceed 1.

5. The analog-to-digital conversion circuit in accordance with claim 4, wherein said final stage of said circuits includes an analog-to-digital converter converting an analog signal supplied from the precedent stage of said circuits to a digital signal.

6. The analog-to-digital conversion circuit in accordance with claim 4, wherein the initial stage of said circuits has a bit structure set to be larger by at least two bits than that in second and higher stages of said circuits, and the second to final stages of said circuits have a bit structure uniformly divided.

7. A voltage comparator comprising:

a comparing circuit performing a comparing operation; and an output circuit starting an output operation after a constant time from starting of said comparing operation of said comparing circuit, wherein said output circuit includes a switch substantially shorting said first and second output terminals when noise appears and opening said first and second output terminals after said noise substantially disappears.

8. The voltage comparator in accordance with claim 7, wherein said comparing circuit has first and second output terminals outputting signals complementary to each other, and said output circuit includes a switch substantially shorting said first and second output terminals when noise appears and opening said first and second output terminals after said noise substantially disappears.

9. A voltage comparator comprising:

a comparing circuit comparing first and second input voltages inputted to first and second input terminals respectively with each other and outputting results of comparison from first and second output terminals as first and second output voltages complementary to each other; and a switch substantially shorting said first and second output terminals before said first and second input voltages are inputted to said first and second input terminals and opening said first and second output terminals in a delay by a constant time from supply of said first and second input voltages to said first and second input terminals.

10. The voltage comparator in accordance with claim 9, wherein said first input voltage is a first differential input voltage, and said second input voltage is a second differential input voltage.

11. A voltage comparator comprising:

a differential amplification circuit having first and second input terminals and first and second output terminals;

a first switch connected between said first input terminal and said first output terminal;

a second switch connected between said second input terminal and said second output terminal;

a first capacitance connected to said first input terminal;

a second capacitance connected to said second input terminal; and a third switch connected between said first output terminal and said second output terminal, wherein said first, second and third switches are brought into ON states while a first input voltage is supplied to an input end of said first capacitance and a second input voltage is supplied to an input end of said second capacitance, and thereafter said first and second switches are brought into OFF states while a third input voltage is supplied to said input end of said first capacitance and a fourth input voltage is supplied to said input end of said second capacitance, and said third switch is brought into an OFF state after a constant time.

12. The voltage comparator in accordance with claim 11, wherein said differential amplification circuit includes:

a first transistor connected between a first power supply potential and said first output terminal, a second transistor connected between said first power supply potential and said second output terminal, a third transistor connected between a second power supply potential and said first output terminal, a fourth transistor connected between said second power supply potential and said second output terminal, and a constant current source interposed in a path between said first power supply potential and said first and second transistors or in a path between said second power supply potential and said third and fourth transistors, said first transistor has a control electrode connected to said first input terminal, and said second transistor has a control electrode connected to said second input terminal.

13. The voltage comparator in accordance with claim 12, wherein each of said third and fourth transistors has a control electrode receiving a prescribed bias voltage.

14. The voltage comparator in accordance with claim 11, wherein said differential amplification circuit includes:

a first transistor connected between a first power supply potential and said first output terminal, a second transistor connected between said first power supply potential and said second output terminal, a third transistor connected between a second power supply potential and said first output terminal, a fourth transistor connected between said second power supply potential and said second output terminal, and a constant current source interposed in a path between said first power supply potential and said first and second transistors or in a path between said second power supply potential and said third and fourth transistors, said third transistor has a control electrode connected to said first input terminal, and said fourth transistor has a control electrode connected to said second input terminal.

15. The voltage comparator in accordance with claim 14, wherein each of said first and second transistors has a control electrode receiving a prescribed bias voltage.

16. The voltage comparator in accordance with claim 11, wherein each of said first, second and third switches is a complementary switch formed by a first conductivity type channel transistor and a second conductivity type channel transistor.

17. The voltage comparator in accordance with claim 11, further comprising:

a fourth switch connected between said first input terminal and a prescribed voltage source, and a fifth switch connected between said second input terminal and said prescribed voltage source, wherein said fourth and fifth switches are brought into ON states when said third switch is in an ON state, while said fourth and fifth switches are brought into OFF states when said third switch is in an OFF state.

18. An operational amplifier comprising:

an amplification circuit having first and second output terminals outputting output signals complementary to each other; and a switch substantially shorting said first and second output terminals when noise appears and opening said first and second output terminals after said noise substantially disappears.

19. An operational amplifier comprising:

an amplification circuit differentially amplifying first and second input voltages inputted to first and second input terminals respectively and outputting first and second output voltages complementary to each other from first and second output terminals; and a switch substantially shorting said first and second output terminals before said first and second input voltages are inputted to said first and second input terminals and opening said first and second output terminals in a delay by a constant time from supply of said first and second input voltages to said first and second input terminals.

20. The operational amplifier in accordance with claim 19, wherein said first input voltage is a first differential input voltage, and said second input voltage is a second differential input voltage.

21. An analog-to-digital converter comprising:

a plurality of comparators each comparing an input voltage with at least one referential potential, each of said plurality of comparators comprising:

a differential amplification circuit having first and second input terminals and first and second output terminals, a first switch connected between said first input terminal and said first output terminal, a second switch connected between said second input terminal and said second output terminal, a first capacitance connected to said first input terminal, a second capacitance connected to said second input terminal, and a third switch connected between said first output terminal and said second output terminal, wherein said first, second and third switches are brought into ON states while a first input voltage is supplied to an input end of said first capacitance and a second input voltage is supplied to an input end of said second capacitance, and thereafter said first and second switches are brought into OFF states while a third input voltage is supplied to said input end of said first capacitance and a fourth input voltage is supplied to said input end of said second capacitance, and said third switch is brought into an OFF state after a constant time.

22. An analog-to-digital conversion circuit having a multistage pipeline structure formed by a plurality of stages, wherein each of said plurality of stages includes an analog-to-digital converter, a digital-to-analog converter and a differential amplifier, said analog-to-digital converter includes a plurality of comparators each comparing an input voltage with at least one referential potential, each of said plurality of comparators comprises:

a differential amplification circuit having first and second input terminals and first and second output terminals, a first switch connected between said first input terminal and said first output terminal, a second switch connected between said second input terminal and said second output terminal, a first capacitance connected to said first input terminal, a second capacitance connected to said second input terminal, and a third switch connected between said first output terminal and said second output terminal, said first, second and third switches are brought into ON states while a first input voltage is supplied to an input end of said first capacitance and a second input voltage is supplied to an input end of said second capacitance, and thereafter said first and second switches are brought into OFF states while a third input voltage is supplied to said input end of said first capacitance and a fourth input voltage is supplied to said input end of said second capacitance, and said third switch is brought into an OFF state after a constant time.

23. An analog-to-digital conversion circuit having a multistage pipeline structure formed by a plurality of stages, wherein each of said plurality of stages includes an analog-to-digital converter, a digital-to-analog converter and a differential amplifier, said differential amplifier includes an operational amplifier, and said operational amplifier comprises:

an amplification circuit differentially amplifying first and second input voltages inputted to first and second input terminals respectively and outputting first and second output voltages complementary to each other from first and second output terminals; and a switch substantially shorting said first and second output terminals before said first and second input voltages are inputted to said first and second input terminals and opening said first and second output terminals in a delay by a constant time from supply of said first and second input voltages to said first and second input terminals.

24. The analog-to-digital conversion circuit in accordance with claim 4, wherein said analog-to-digital converter performs conversion and said first operational amplifier performs amplification and holding at the same time while said digital-to-analog converter performs conversion and said second amplifier performs amplification and holding at the same time at each stage of said circuits.

* * * * *